(12) United States Patent
Sugiyama et al.

(10) Patent No.: US 8,440,734 B2
(45) Date of Patent: May 14, 2013

(54) POSITIVE PHOTOSENSITIVE RESIN COMPOSITION, CURED FILM, PROTECTING FILM, INSULATING FILM, AND SEMICONDUCTOR DEVICE AND DISPLAY DEVICE USING THE SAME

(75) Inventors: Hiromichi Sugiyama, Tokyo (JP); Hiroaki Makabe, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 118 days.

(21) Appl. No.: 13/002,953

(22) PCT Filed: Jun. 19, 2009

(86) PCT No.: PCT/JP2009/061170
§ 371 (c)(1),
(2), (4) Date: Jan. 6, 2011

(87) PCT Pub. No.: WO2010/004849
PCT Pub. Date: Jan. 14, 2010

(65) Prior Publication Data
US 2011/0118375 A1    May 19, 2011

(30) Foreign Application Priority Data
Jul. 8, 2008    (JP) .................................. 2008-178339

(51) Int. Cl.
*G03F 7/029* (2006.01)
*C08F 2/50* (2006.01)
*H05B 6/68* (2006.01)

(52) U.S. Cl.
USPC .................. 522/48; 522/47; 522/6; 522/1

(58) Field of Classification Search .................... 522/48, 522/47, 6, 1
See application file for complete search history.

(56) References Cited

U.S. PATENT DOCUMENTS

| 8,080,350 B2 * | 12/2011 | Banba et al. ............... 430/14 |
| 2010/0044888 A1 | 2/2010 | Terakawa |
| 2010/0196808 A1 * | 8/2010 | Mizushima et al. ......... 430/18 |

FOREIGN PATENT DOCUMENTS

| JP | 6-35185 A | | 2/1994 |
| JP | 2003-131368 A | * | 5/2003 |
| JP | 2004-4233 A | | 1/2004 |
| JP | 2004-004233 A | * | 1/2004 |
| JP | 2004-125814 A | * | 4/2004 |
| WO | WO 2007/063721 | * | 6/2007 |
| WO | WO 2008/050886 A1 | | 5/2008 |

OTHER PUBLICATIONS

International Search Report for PCT/JP2009/061170, mailed on Jul. 14, 2009.
Chinese Office Action for Chinese Application No. 2009-80125721.2 dated Jul. 3, 2012.

* cited by examiner

*Primary Examiner* — Ling Choi
*Assistant Examiner* — Jessica E Whiteley
(74) *Attorney, Agent, or Firm* — Birch, Stewart, Kolasch & Birch, LLP

(57) ABSTRACT

The object of the present invention is to provide a positive photosensitive resin composition which produces no scum and has high sensitivity and high resolution, a cured film, a protecting film, an insulating film, a semiconductor device using the same. The positive photosensitive resin composition of the present invention comprises a specific polyamide resin (A) and a photosensitive agent (B) comprising an ester of a specific phenolic compound with at least one of 1,2-naphthoquinonediazide-4 sulfonic acid and 1,2-naphthoquinonediazide-5-sulfonic acid. The cured film of the present invention comprises a cured product of the positive photosensitive resin composition. The protecting film and insulating film of the present invention comprise the cured film each. The semiconductor device and display device of the present invention have the cured film each.

8 Claims, No Drawings

POSITIVE PHOTOSENSITIVE RESIN COMPOSITION, CURED FILM, PROTECTING FILM, INSULATING FILM, AND SEMICONDUCTOR DEVICE AND DISPLAY DEVICE USING THE SAME

TECHNICAL FIELD

The present invention relates to a positive photosensitive resin composition, a cured film, a protecting film, an insulating film, and a semiconductor device and a display device using the same.

BACKGROUND ART

Polyimide resin, which has excellent heat resistance and outstanding electrical and mechanical properties, has been used for forming surface protection and interlayer insulation films of semiconductor devices. In recent years, however, polybenzoxazole resin has begun to be used because it does not have an imide ring-derived, highly polar carbonyl group and thus shows good moisture resistance reliability. In addition, a photosensitive resin composition has been developed, which comprises a resin provided with photosensitivity and is thus able to simplify a part of the process of forming a relief pattern.

Recently, positive photosensitive resin compositions comprising a polybenzoxazole precursor and a diazoquinone compound (photosensitive agent) have been developed, which can be developed with alkaline aqueous solutions as a result of further improvements in safety (for example, see Patent Literature 1).

Herein, the production of a relief pattern with a positive photosensitive resin composition and the mechanism of developing the same will be described. A coating film of a positive photosensitive resin composition is formed on a wafer and exposed to actinic radiation with an exposure device through a mask, the device being called "stepper". As a result, a portion of the film which was subjected to the exposure (hereinafter referred to as "exposed portion") and a portion of the same which was not subjected to the exposure (hereinafter referred to as "unexposed portion") are formed. The diazoquinone compound which is present in the unexposed portion is insoluble in alkaline aqueous solutions; moreover, it becomes resistant to alkaline aqueous solutions by the interaction with the resin. On the other hand, the diazoquinone compound which is present in the exposed portion causes chemical change by the action of the actinic radiation to produce a carboxylic acid; therefore, it becomes soluble in alkaline aqueous solutions and accelerates the dissolution of the resin. By dissolving and removing the exposed portion using the solubility difference between the exposed and unexposed portions, it becomes able to produce a relief pattern comprising the unexposed portion only.

In the case of using such a photosensitive composition, its sensitivity is very important. When the sensitivity is low, that is, when the sensitivity is poor, it takes a long exposure time, resulting in a low throughput.

Consequently, to improve the sensitivity of the photosensitive resin composition, when the concentration of the photosensitive group (naphthoquinone diazide sulfonyl group) in the photosensitive resin composition is increased by adding a large amount of photosensitive agent (photosensitive diazoquinone compound) or increasing the substitution rate of the photosensitive group in the photosensitive agent, the dissolution rate of the exposed portion is accelerated, that is, the sensitivity is improved. However, there is a problem that an undissolved residue of the photosensitive resin composition (hereinafter referred to as "scum") is produced at the bottom of the pattern in the exposed portion after development, the residue being derived from, for example, the photosensitive resin composition which comprises the photosensitive agent, etc. which failed to be an alkali-soluble compound since the actinic radiation caused poor chemical change.

A different method for improving the sensitivity is a method in which, while the developing time is lengthened to increase the dissolution amount of the exposed portion in alkaline aqueous solutions, for increasing the resistance of the unexposed portion to alkaline aqueous solutions, the concentration of the photosensitive group in the photosensitive resin composition is increased as described above, the dissolution rate of the unexposed portion is decreased by increasing the molecular weight of the resin, or the molecular weight of a phenolic compound is increased, which is a component that retains or supports the photosensitive agent. However, this method not only results in a low throughput but also increases the scum.

Similarly, when the dissolution rate of the exposed portion is increased by, for example, decreasing the molecular weight of the resin to increase the dissolution amount of the exposed portion in alkaline aqueous solutions, the unexposed portion is also more likely to be soluble; therefore, it is difficult to form a relief pattern and when it collapses, there is a problem such as scum production and a deterioration in resolution. Furthermore, the unexposed portion is needed to have a predetermined film thickness or more, so that the developing time is extremely shortened, and not only is it difficult to control pattern production, but also there is a deterioration in the sensitivity of the photosensitive resin composition, to the contrary.

It is also important to improve resolution because, with an increase in the degree of integration of semiconductor chips in recent years, the size of relief pattern has been declining steadily. It is said that there is a trade-off relationship between resolution and sensitivity; therefore, there is a strong demand for the development of a photosensitive resin composition which produces no scum, shows high sensitivity and high resolution, and has high relief pattern productivity.

A positive photosensitive resin composition is mentioned in Patent Literature 2, which comprises an alkaline soluble resin consisting of an acrylic copolymer, 1,2-naphthoquinone diazide-5-(and/or -4-) sulfonyl ester using a polyhydroxy compound and a crosslink agent, and tetrakisphenol compounds are mentioned as polyhydroxy compound examples (see formulae [I-c] to [I-e] in paragraph 0037 of the literature).

However, the positive photosensitive resin composition of Patent Literature 2 uses an acrylic copolymer as the alkaline soluble resin and uses no polyimide resin or polybenzoxazole resin.

CITATION LIST

Patent Literature 1: Japanese Patent Application Laid-Open (JP-A) No. 2004-125814
Patent Literature 2: JP-A No. 2004-004233

SUMMARY OF INVENTION

Technical Problem

The present invention was achieved in light of the above circumstances and the object of the present invention is to provide a positive photosensitive resin composition which produces no scum and has high sensitivity and high resolution, a cured film, a protecting film, an insulating film, and a semiconductor device and a display device using the same.

Solution to Problem

The object was achieved by the present invention described below under [1] to [9].

[1] A positive photosensitive resin composition comprising:

a polyamide resin (A) comprising a polymer including a repeating unit represented by the following formula (1), and a photosensitive agent (B) comprising an ester of a phenolic compound represented by the following formula (2) with at least one of 1,2-naphthoquinonediazide-4-sulfonic acid and 1,2-naphthoquinonediazide-5-sulfonic acid:

[Chemical Formula 1]

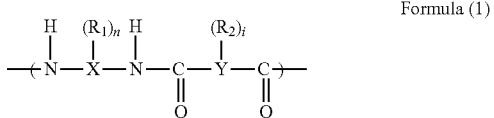

Formula (1)

wherein each of X and Y is an organic group; $R_1$ is a hydroxyl group, —O—$R_3$, an alkyl group, an acyloxy group or a cycloalkyl group; $R_2$ is a hydroxyl group, a carboxyl group, —O—$R_3$ or —COO—$R_3$; h is an integer from 0 to 8; i is an integer from 0 to 8; $R_3$ is an organic group having 1 to 15 carbon atoms; when there are plurality of $R_1$s, $R_2$s or $R_3$s, they may be the same or different from each other; when there is no hydroxyl group as $R_1$, at least one $R_2$ has to be a carboxyl group; and when there is no carboxyl group as $R_2$, at least one $R_1$ has to be a hydroxyl group; and

[Chemical Formula 2]

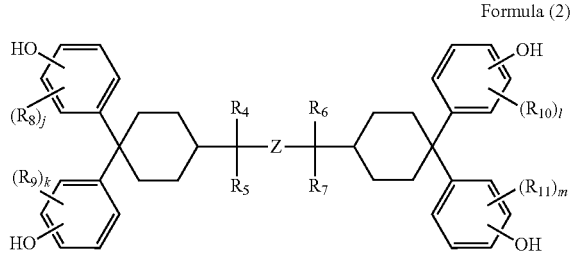

Formula (2)

wherein Z is an organic group; each of $R_4$ to $R_7$ is a hydrogen atom or an alkyl group; each of $R_8$ to $R_{11}$ is a hydrogen atom, a hydroxyl group, a halogen atom, an alkyl group, an alkoxy group, an alkenyl group or a cycloalkyl group; each of j to m is an integer from 0 to 4; and when there are plurality of $R_8$s, $R_9$s, $R_{10}$s or $R_{11}$s, they may be the same or different from each other.

[2] The positive photosensitive resin composition according to [1], wherein in the polyamide resin (A), X of the formula (1) contains a repeating unit having a structure selected from the group consisting of the following formulae (3-1) to (3-6):

[Chemical Formula 3]
Formula (3)

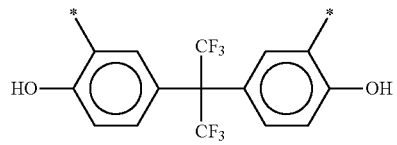

Formula (3-1)

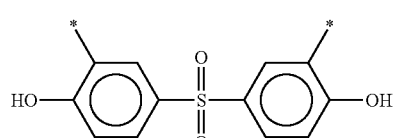

Formula (3-2)

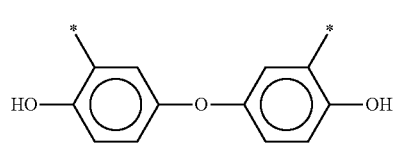

Formula (3-3)

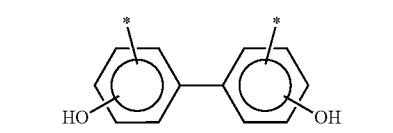

Formula (3-4)

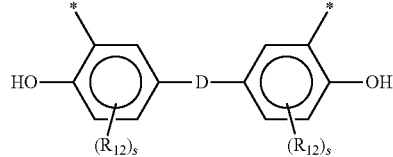

Formula (3-5)

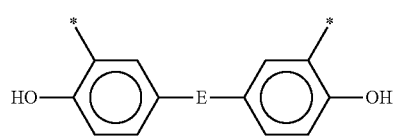

Formula (3-6)

wherein * means being connected to an NH group; D in the formula (3-5) is —$CH_2$—, —CH($CH_3$)—, —C($CH_3$)$_2$—, —O—, —S—, —$SO_2$—, —CO—, —NHCO—, —C($CF_3$)$_2$— or a single bond; E in the formula (3-6) is —$CH_2$—, —CH($CH_3$)— or —C($CH_3$)$_2$—; $R_{12}$ is an alkyl group, an alkoxy group, an acyloxy group or a cycloalkyl group; s is an integer from 1 to 3; and when there are plurality of $R_{12}$s, they may be the same or different from each other.

[3] The positive photosensitive resin composition according to [1] or [2], wherein Z in the phenolic compound represented by the formula (2) contains a structure selected from the group consisting of the following formulae (4-1) and (4-2):

[Chemical Formula 4]
Formula (4)

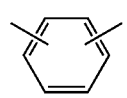

Formula (4-1)

-continued

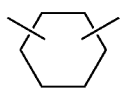

Formula (4-2)

[4] The positive photosensitive resin composition according to any of [1] to [3], wherein the phenolic compound represented by the formula (2) contains at least one or more kinds selected from the group consisting of the following formulae (5-1) to (5-5):

[Chemical Formula 5]
Formula (5)

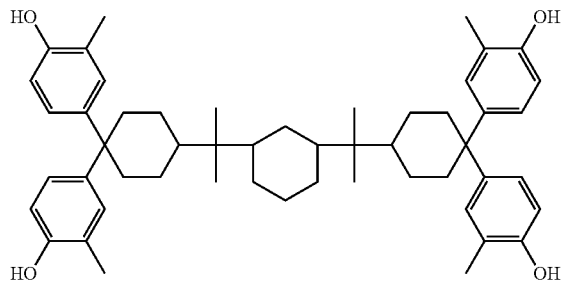

Formula (5-1)

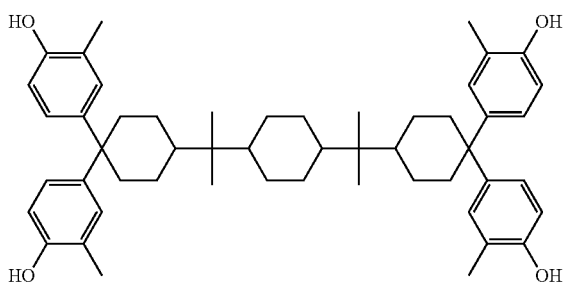

Formula (5-2)

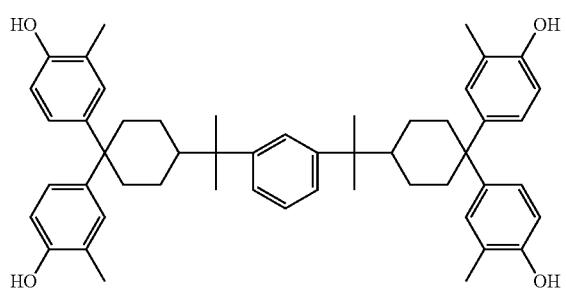

Formula (5-3)

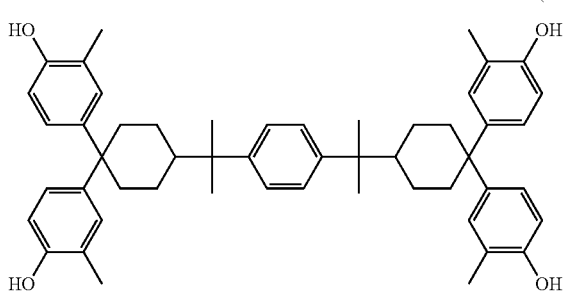

Formula (5-4)

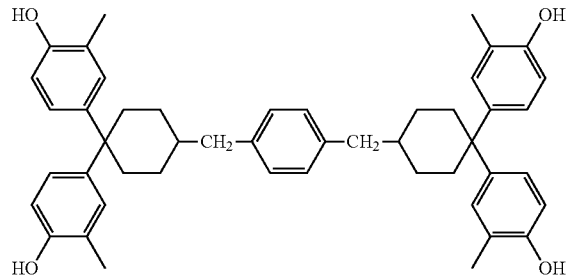

Formula (5-5)

[5] A cured film comprising a cured product of the positive photosensitive resin composition defined by any of [1] to [4].

[6] A protecting film comprising the cured film defined by [5].

[7] An insulating film comprising the cured film defined by [5].

[8] A semiconductor device having the cured film defined by [5].

[9] A display device having the cured film defined by [5].

Advantageous Effects of Invention

According to the present invention, a positive photosensitive resin composition which produces no scum and has high sensitivity and high resolution, a cured film, a protecting film, an insulating film, a semiconductor device using the same and a display device, are obtained.

DESCRIPTION OF EMBODIMENTS

Hereinafter, a suitable embodiment of the positive photosensitive resin composition, cured film, protecting film, insulating film, semiconductor device and display device of the present invention will be described each in detail.

(1) Positive Photosensitive Resin Composition

The positive photosensitive resin composition will be described below.

The positive photosensitive resin composition of the present invention is a positive photosensitive resin composition comprising a polyamide resin (A) including a repeating unit represented by the following formula (1), and a photosensitive agent (B) comprising an ester of a phenolic compound represented by the following formula (2) with at least one of 1,2-naphthoquinonediazide-4-sulfonic acid and 1,2-naphthoquinonediazide-5-sulfonic acid:

[Chemical Formula 6]

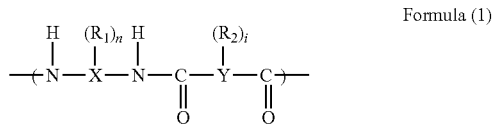

Formula (1)

wherein each of X and Y is an organic group; $R_1$ is a hydroxyl group, —O—$R_3$, an alkyl group, an acyloxy group or a cycloalkyl group; $R_2$ is a hydroxyl group, a carboxyl group, —O—$R_3$ or —COO—$R_3$; h is an integer from 0 to 8; i is an integer from 0 to 8; $R_3$ is an organic group having 1 to 15 carbon atoms; when there are plurality of $R_1$s, $R_2$s or $R_3$s, they may be the same or different from each other; when there is no hydroxyl group as $R_1$, at least one $R_2$ has to be a carboxyl group; and when there is no carboxyl group as $R_2$, at least one $R_1$ has to be a hydroxyl group; and

[Chemical Formula 7]

Formula (2)

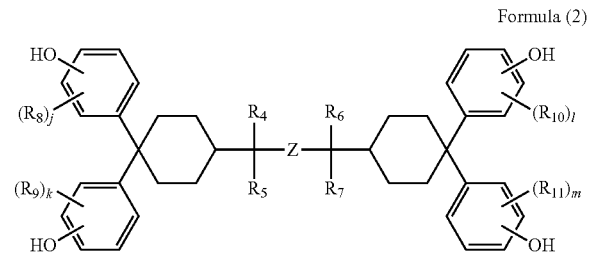

wherein Z is an organic group; each of $R_4$ to $R_7$ is a hydrogen atom or an alkyl group; each of $R_8$ to $R_{11}$ is a hydrogen atom, a hydroxyl group, a halogen atom, an alkyl group, an alkoxy group, an alkenyl group or a cycloalkyl group; each of j to m is an integer from 0 to 4; and when there are plurality of $R_8$s, $R_9$s, $R_{10}$s or $R_{11}$s, they may be the same or different from each other.

The polyamide resin (A) is a polymer which has a main chain backbone including a polyamide structure and which has a hydroxyl group, carboxyl group, ether group or ester group in the main chain backbone or a side chain of the backbone. When the polyamide resin (A) is cured by heating, by the action of the hydroxyl group, carboxyl group, ether group or ester group, it causes a cyclization reaction which involves the elimination of a small molecule, thereby producing a cured product having a cyclic structure in the main chain backbone. Also, this polymer has a hydroxyl group and/or carboxyl group that is necessary to exhibit alkali solubility.

Examples of the polyamide resin (A) include a polymer having a polybenzoxazole precursor structure, a polymer having a polyimide precursor structure and a polymer having a polyamic acid ester structure (a structure in which an acid group of the polyamic acid is esterified), in addition to a copolymer comprising at least one of the three precursor structures, a mixture of a polybenzoxazole precursor polymer and a polybenzoxazole derived therefrom, a mixture of a polyimide precursor polymer and a polyimide derived therefrom, a partially cyclized product in which a part of the repeating unit that is present in the molecule of a polybenzoxazole precursor polymer is changed to a benzoxazole ring, a mixture of a polybenzoxazole precursor polymer and a partially cyclized product thereof, a partially cyclized product in which a part of the repeating unit that is present in the molecule of a polyimide precursor polymer is changed to an imide ring, and a mixture of a polyimide precursor polymer and a partially cyclized product thereof.

Particularly preferred as the polyamide resin (A) is a polymer comprising a polybenzoxazole precursor structure. This is because the polymer has a hydroxyl group, which has an acidity that is not higher than that of a carboxyl group but is appropriate, so that while the exposed portion is soluble, the unexposed portion is allowed to be sufficiently resistant to alkaline aqueous solutions by the interaction with a photosensitive group, thereby obtaining an excellent relief pattern with no pattern collapse. Also, this is because when the benzoxazole structure is contained in the cured product, the cured product does not contain a carbonyl group, which is a polar group compared to the imide structure, so that there is an increase in the moisture resistance reliability of a semiconductor device.

In the polyamide resin (A) including a repeating unit represented by the formula (1), —O—$R_3$, which is a substituent of X, and —O—$R_3$ and —COO—$R_3$, which are each a substituent of Y, are each a group which is protected by $R_3$ that is an organic group having 1 to 15 carbon atoms, for the purpose of controlling the solubility of the hydroxyl or carboxyl group in alkaline aqueous solutions. $R_3$ can also protect the hydroxyl or carboxyl group as needed. Examples of $R_3$ include a formyl group, a methyl group, an ethyl group, a propyl group, an isopropyl group, a t-butyl group, a t-butoxycarbonyl group, a phenyl group, a benzyl group, a tetrahydrofuranyl group and a tetrahydropyranyl group.

In the present invention, "organic group" refers to a hydrocarbon structure that can contain a heteroatom other than a carbon atom.

The polyamide resin (A) is obtained by the reaction of, for example, a compound selected from a diamine, bis(aminophenol), all of which containing the organic group X, 2,4-diaminophenol, etc. with a compound selected from a tetracarboxylic dianhydride, a trimellitic anhydride, a dicarboxylic acid, a dicarboxylic acid dichloride, a dicarboxylic acid derivative, a hydroxy dicarboxylic acid, a hydroxy dicarboxylic acid derivative, etc., all of which containing the organic group Y.

When the compound is a dicarboxylic acid, to increase the reaction yield, etc., an active ester type dicarboxylic acid derivative can be used, which is produced by previously reacting the dicarboxylic acid with 1-hydroxy-1,2,3-benzotriazole, etc.

Examples of X in the formula (1) include aromatic compounds such as a benzene ring and naphthalene ring, bisphenols, heterocyclic compounds such as pyrroles and furans and siloxane compounds. More specifically, preferred examples of X include those represented by the following formula (6), that is, the formulae (6-1) to (6-7). As needed, they can be used alone or in combination of two or more kinds.

[Chemical Formula 8]
Formula (6)

Formula (6-1)

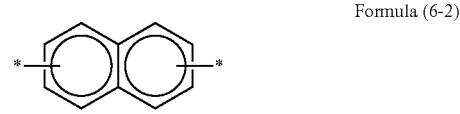

Formula (6-2)

Formula (6-3)

Formula (6-4)

Formula (6-5)

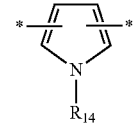

Formula (6-6)

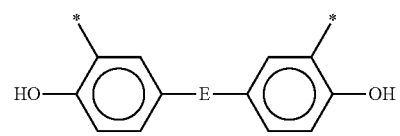

Formula (6-7)

*—R$_{15}$—Si(R$_{17}$)(R$_{18}$)—O—Si(R$_{17}$)(R$_{18}$)—R$_{16}$—*

In the formulae, * means being connected to an NH group; A is —$CH_2$—, —$CH(CH_3)$—, —$C(CH_3)_2$—, —O—, —S—, —$SO_2$—, —CO—, —NHCO—, —$C(CF_3)_2$— or a single bond; $R_{13}$ is one selected from an alkyl group, an alkyl ester group and a halogen atom, and $R_{13}$s may be the same or different from each other; $R_{14}$ is any of an alkyl group, an alkoxy group, an acyloxy group and a cycloalkyl group, and $R_{14}$s may be the same or different from each other; r is an integer of 0 to 4; and $R_{15}$ to $R_{18}$ are an organic group each.

As shown by the formula (1), the number of $R_1$ connected to X is 0 to 8 ($R_1$ is omitted in the formulae (6-1) to (6-7)).

Among the formula (6), those represented by the following formula (7), that is, the formulae (7-1) to (7-17) are preferred, so that the positive photosensitive resin composition shows particularly excellent heat resistance and mechanical properties. In the formula (7), $R_1$ is shown. For example, the formula (7-1) is a structure that is encompassed in the formula (6-3).

[Chemical Formula 9]
Formula (7)-(1/2)

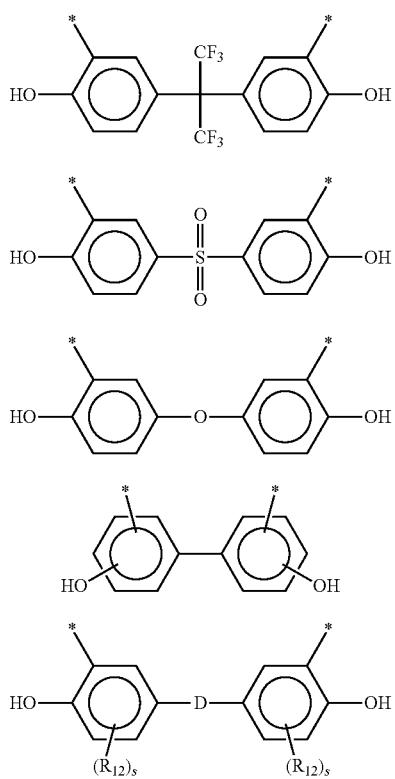

Formula (7-1)
Formula (7-2)
Formula (7-3)
Formula (7-4)
Formula (7-5)

Formula (7-6)
Formula (7-7)
Formula (7-8)
Formula (7-9)
Formula (7-10)
Formula (7-11)
Formula (7-12)
Formula (7-13)

In the formulae, * means being connected to an NH group; D in the formula (7-5) is —$CH_2$—, —$CH(CH_3)$—, —$C(CH_3)_2$—, —O—, —S—, —$SO_2$—, —CO—, —NHCO—, —$C(CF_3)_2$— or a single bond; E in the formula (7-6) is —$CH_2$—, —$CH(CH_3)$— or —$C(CH_3)_2$—; $R_{12}$ is any of an alkyl group, an alkoxy group, an acyloxy group and a cycloalkyl group, and $R_{12}$s may be the same or different from each other; $R_{19}$ is one selected from an alkyl group, an alkyl ester group and a halogen atom, and $R_{19}$s may be the same or different from each other; s is an integer of 1 to 3; and t is an integer of 0 to 4.

[Chemical Formula 10]
Formula (7)-(2/2)

Formula (7-14)

*—(CH$_2$)$_3$—Si(CH$_3$)(CH$_3$)—O—Si(CH$_3$)(CH$_3$)—(CH$_2$)$_3$—*

Formula (7-15)

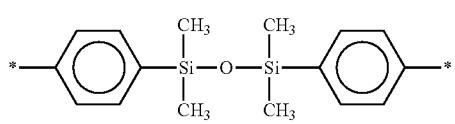

Formula (7-16)

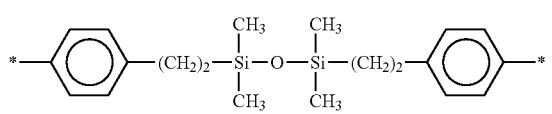

Formula (7-17)

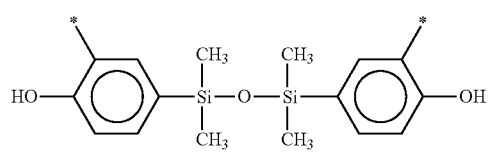

In the formulae, * means being connected to an NH group.

Furthermore, among the formula (7), those represented by the following formula (3), that is, the following formulae (3-1) to (3-6) are particularly preferred. When X of the polyamide resin (A) represented by the formula (1) is the following formula (3), the positive photosensitive resin composition shows particularly excellent heat resistance and mechanical properties.

[Chemical Formula 11]
Formula (3)

Formula (3-1)

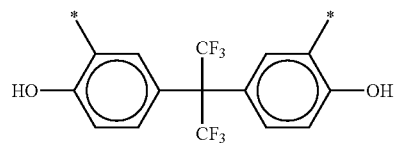

Formula (3-2)

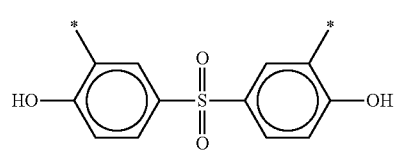

Formula (3-3)

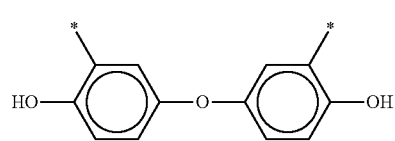

Formula (3-4)

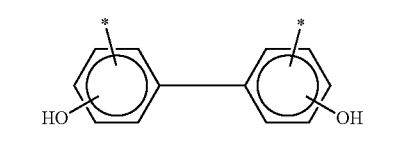

Formula (3-5)

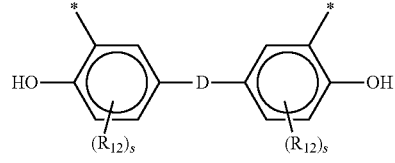

Formula (3-6)

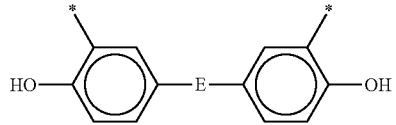

In the formulae, * means being connected to an NH group: D in the formula (3-5) is —$CH_2$—, —$CH(CH_3)$—, —$C(CH_3)_2$—, —O—, —S—, —$SO_2$—, —CO—, —NHCO—, —$C(CF_3)_2$— or a single bond; E in the formula (3-6) is —$CH_2$—, —$CH(CH_3)$— or —$C(CH_3)_2$—; $R_{12}$ is an alkyl group, an alkoxy group, an acyloxy group or a cycloalkyl group; s is an integer of 1 to 3; when there are plurality of $R_{12}$s, they may be the same or different from each other.

Y of the polyamide resin (A) represented by the formula (1) is an organic group. Examples of Y are the same as the above-described examples of X, including aromatic compounds such as a benzene ring and naphthalene ring, bisphenols, heterocyclic compounds such as pyrroles, pyridines and furans, and siloxane compounds. More specifically, those represented by the following formula (8), that is, the formulae (8-1) to (8-8) are preferred. They can be used alone or in combination of two or more.

[Chemical Formula 12]
Formula (8)

Formula (8-1)

Formula (8-2)

Formula (8-3)

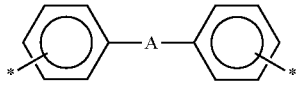

Formula (8-4)

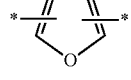

Formula (8-5)

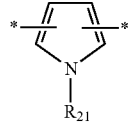

Formula (8-6)

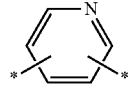

Formula (8-7)

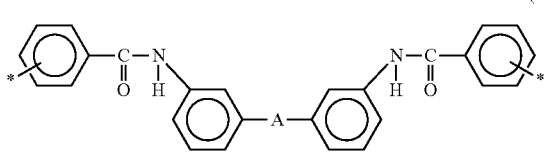

Formula (8-8)

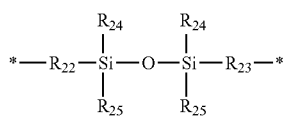

In the formulae, * means being connected to a C=O group; A is —$CH_2$—, —$CH(CH_3)$—, —$O(CH_3)_2$—, —O—, —S—, —$SO_2$—, —CO—, —NHCO—, —$C(CF_3)_2$— or a single bond; $R_{20}$ is one selected from an alkyl group, an alkyl ester group and a halogen atom, and $R_{20}$s may be the same or different from each other; $R_{21}$ is one selected from a hydrogen atom, an alkyl group, an alkyl ester group and a halogen atom; $R_{22}$ to $R_{25}$ are an organic group each; u is an integer of 0 to 4.

As shown by the formula (1), the number of $R_2$ connected to Y is 0 to 8 ($R_2$ is omitted in the formula (8)).

Among the formula (8), those represented by the following formula (9), that is, the formulae (9-1) to (9-21) and those represented by the formula (10), that is, the formulae (10-1) to (10-4) are preferred, so that the positive photosensitive resin composition shows excellent heat resistance and mechanical properties. In the formulae (9) and (10), $R_2$ is shown. For example, the formula (9-6) is a structure that is encompassed in the formula (8-3).

The tetracarboxylic dianhydride-derived structures in the following formula (9) include a structure in which both of the positions connected to a C=O group each are meta positions, and a structure in which both of the positions are para positions. The tetracarboxylic dianhydride-derived structures can include a structure in which the positions are a meta position and a para position.

[Chemical Formula 13]
Formula (9)-(1/2)

Formula (9-1)

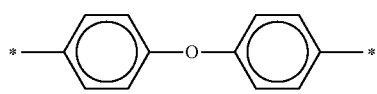

Formula (9-2)

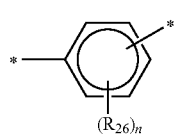

Formula (9-3)

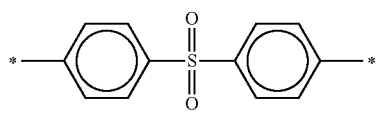

Formula (9-4)

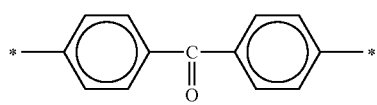

Formula (9-5)

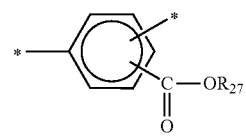

Formula (9-6)

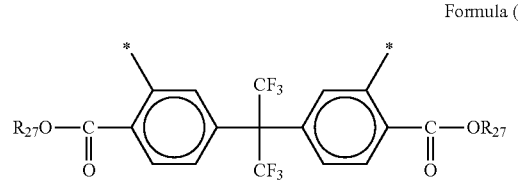

Formula (9-7)

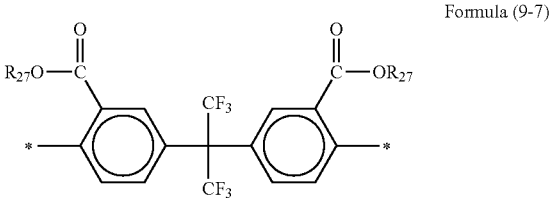

Formula (9-8)

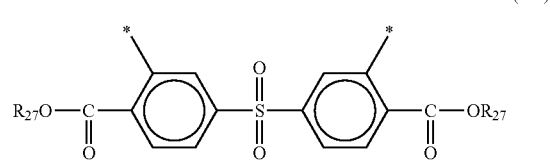

Formula (9-9)

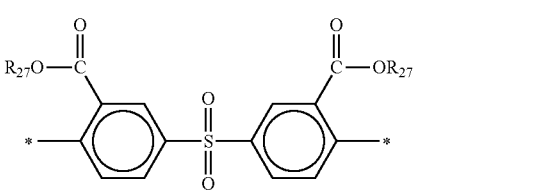

Formula (9-10)

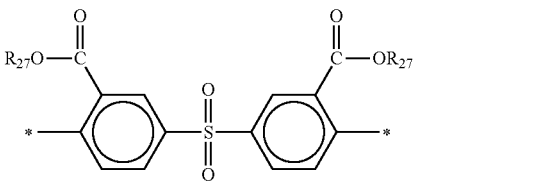

Formula (9-11)

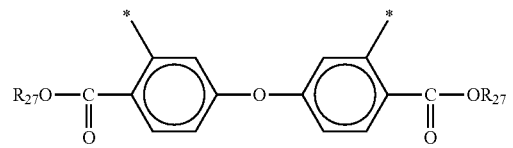

Formula (9-12)

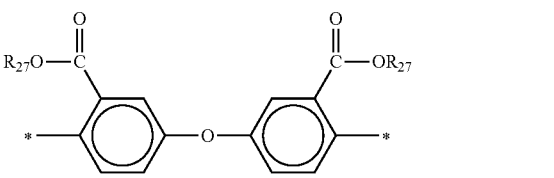

Formula (9-13)

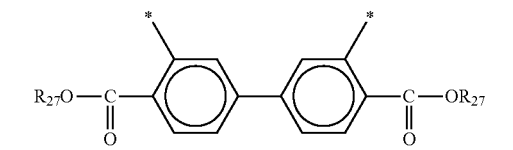

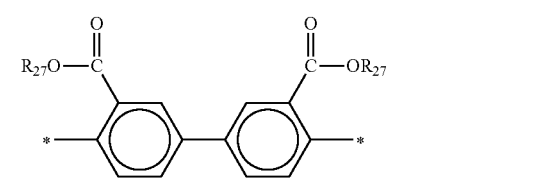

Formula (9-14)

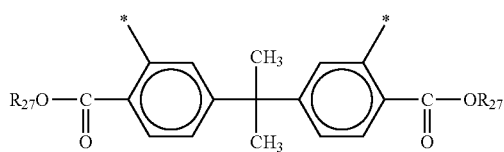

In the formulae, * means being connected to a C=O group; $R_{26}$ is one selected from an alkyl group, an alkyl ester group, an alkyl ether group, a benzyl ether group and a halogen atom, and $R_{26}$s may be the same or different from each other; $R_{27}$ is one selected from a hydrogen atom or an organic group having 1 to 15 carbon atoms and can be partially substituted; n is an integer of 0 to 4.

[Chemical Formula 14]
Formula (9)-(2/2)

Formula (9-15)

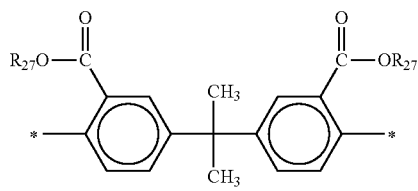

Formula (9-16)

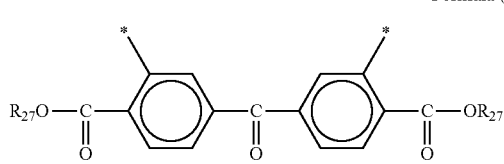

Formula (9-17)

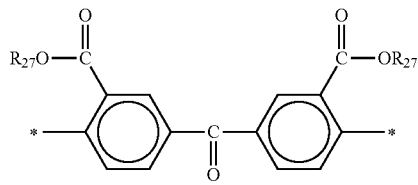

Formula (9-18)

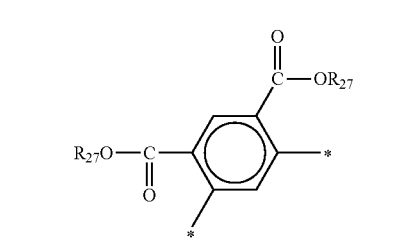

Formula (9-19)

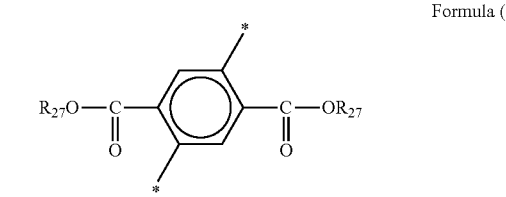

Formula (9-20)

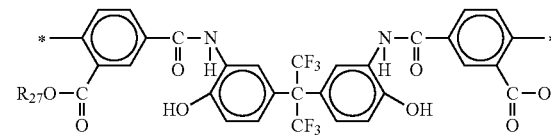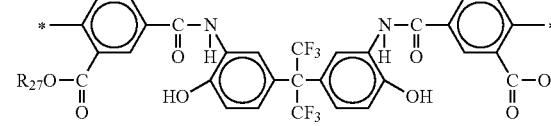

Formula (9-21)

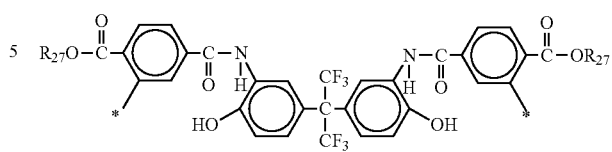

In the formulae, * means being connected to a C=O group; $R_{27}$ is one selected from a hydrogen atom and an organic group having 1 to 15 carbon atoms and can be partially substituted.

[Chemical Formula 15]
Formula (10)

Formula (10-1)

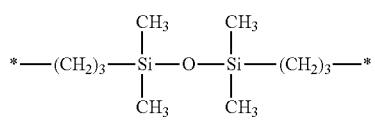

Formula (10-2)

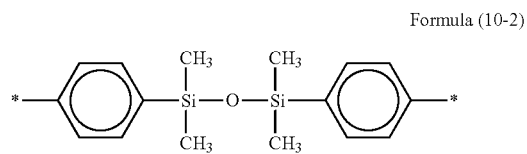

Formula (10-3)

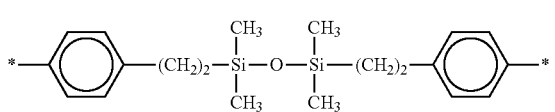

Formula (10-4)

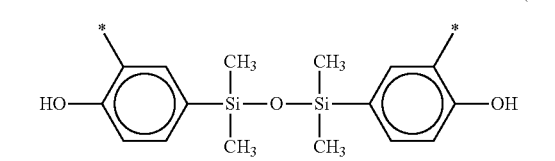

In the formulae, * means being connected to a C=O group.

Furthermore, among the formulae (9) and (10), those represented by the following formula (11), that is, the formulae (11-1) to (11-4) are particularly preferred.

When Y of the polyamide resin represented by the formula (1) is the following formula (11), the positive photosensitive resin composition shows particularly excellent heat resistance and mechanical properties.

[Chemical Formula 16]
Formula (11)

Formula (11-1)

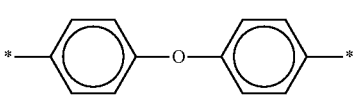

Formula (11-2)

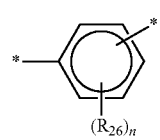

-continued

Formula (11-3)

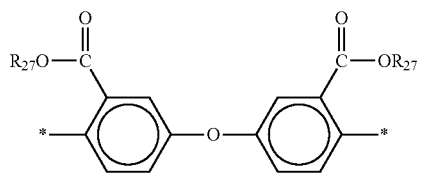

Formula (11-4)

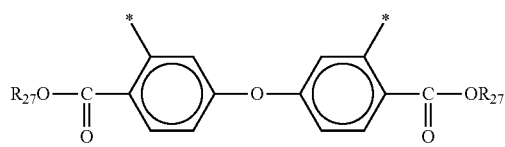

In the formulae, * means being connected to a C=O group; $R_{26}$ is one selected from an alkyl group, an alkyl ester group, an alkyl ether group, a benzyl ether group and a halogen atom, and $R_{26}$s may be the same or different from each other; $R_{27}$ is one selected from a hydrogen atom and an organic group having 1 to 15 carbon atoms and can be partially substituted; n is an integer of 0 to 4.

The polyamide resin (A) including a repeating unit represented by the above formula (1) is preferably such that the polymer chain of the polyamide resin (A) has an amino group at one end thereof and the amino group is capped with, to be an amide, an acid anhydride which contains an aliphatic group or a cyclic compound group that has at least one alkenyl or alkynyl group. Because of this, there is an increase in the shelf stability of the positive photosensitive resin composition. Examples of the group which is attributed to, as just described, the acid anhydride that was reacted with the amino group, the acid anhydride containing an aliphatic group or a cyclic compound group that has at least one alkenyl or alkynyl group, include groups represented by the formula (12), that is, the formulae (12-1) to (12-8), and groups represented by the formula (13), that is, the formulae (13-1) to (13-8). They may be used alone or in combination of two or more.

[Chemical Formula 17]
Formula (12)

Formula (12-1)

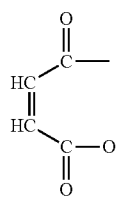

Formula (12-2)

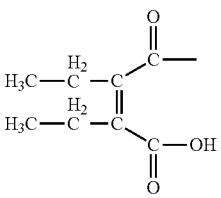

Formula (12-3)

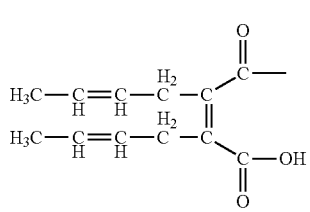

Formula (12-4)

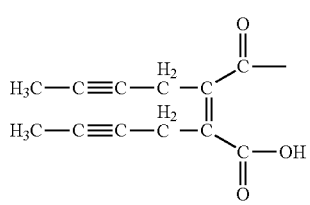

Formula (12-5)

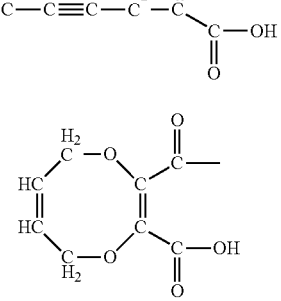

Formula (12-6)

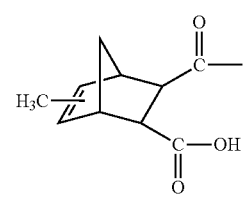

Formula (12-7)

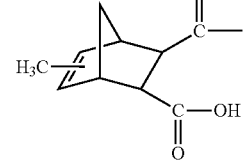

Formula (12-8)

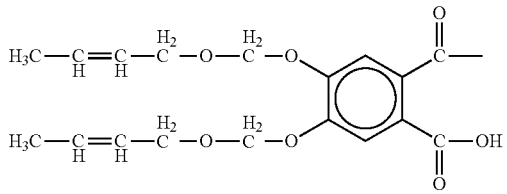

[Chemical Formula 18]
Formula (13)

Formula (13-1)

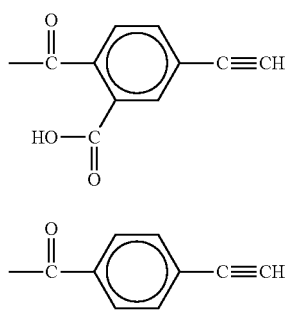

Formula (13-2)

-continued

Formula (13-3)
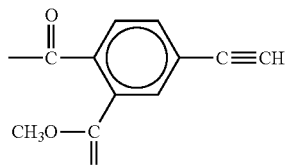

Formula (13-4)
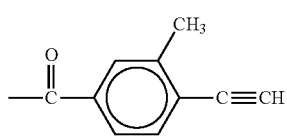

Formula (13-5)
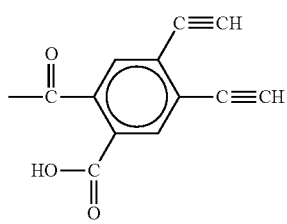

Formula (13-6)
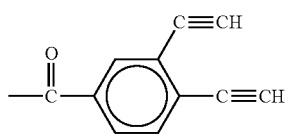

Formula (13-7)
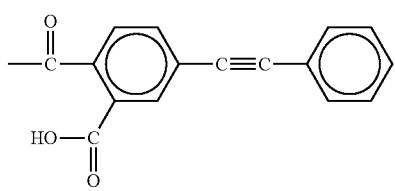

Formula (13-8)
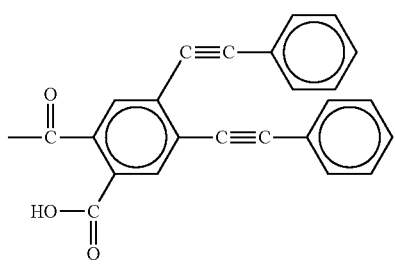

Of these, groups represented by the formula (14), that is, the formulae (14-1) to (14-3) are particularly preferred. Thereby, particularly, there is an increase in the shelf stability of the positive photosensitive resin composition.

[Chemical Formula 19]
Formula (14)

Formula (14-1)
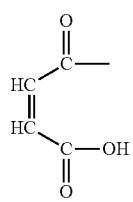

-continued

Formula (14-2)
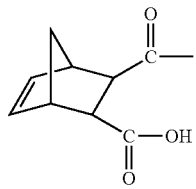

Formula (14-3)
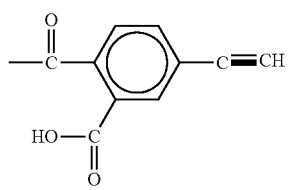

The capping method is not limited to the above method. The acid group at one end of the polymer chain of the polyamide resin (A) can be capped with, to be an amide, an amine derivative which contains an aliphatic group or a cyclic compound group that has at least one alkenyl or alkynyl group.

The polymer chain of the polyamide resin (A) can have a nitrogen-containing cyclic compound at least one of a side chain of the polymer chain and the other end of the same. Because of this, there is an increase in the adhesion of a cured film of the polyamide resin (A) to metal wiring (especially copper wiring) etc. This is because when one end of the polymer chain of the polyamide resin (A) has an organic group having an unsaturated group, the unsaturated group at the end reacts, so that a cured film of the polyamide resin (A) shows excellent mechanical properties (e.g., excellent tensile elongation rate). Meanwhile, when the polymer chain of the polyamide resin (A) has a nitrogen-containing cyclic compound at least one of a side chain of the polymer chain and the other end of the same, the nitrogen-containing cyclic compound reacts with metal wiring of copper and copper alloy, so that a cured film of the polyamide resin (A) shows excellent adhesion.

Examples of the nitrogen-containing cyclic compound include a 1-(5-1H-triazoyl)methylamino group, a 3-(1H-pyrazoyl)amino group, a 4-(1H-pyrazoyl)amino group, a 5-(1H-pyrazoyl)amino group, a 1-(3-1H-pyrazoyl)methylamino group, a 1-(4-1H-pyrazoyl)methylamino group, a 1-(5-1H-pyrazoyl)methylamino group, a (1H-tetrazol-5-yl) amino group, a 1-(1H-tetrazole-5-yl)methyl-amino group and a 3-(1H-tetrazole-5-yl)benz-amino group. Of these, compounds represented by the formula (15), that is, the formulae (15-1) to (15-2) are preferred. Because of this, especially, there is an increase in the adhesion of a cured film of the polyamide resin (A) to metal wiring of copper and copper alloys.

[Chemical Formula 20]
Formula (15)

Formula (15-1)
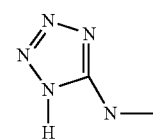

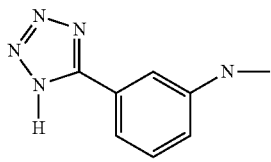

Formula (15-2)

The number average molecular weight (Mn) of the polyamide resin (A) is preferably 5,000 to 40,000, particularly preferably 6,000 to 20,000. The number molecular average weight (Mn) can be measured with a molecular weight measuring apparatus using gel permeation chromatography (GPC) and by calibration using a polystyrene standard polymer.

The positive photosensitive resin composition of the present invention comprises the photosensitive agent (B) comprising an ester of a phenolic compound represented by the aforementioned formula (2) with at least one of 1,2-naphthoquinonediazide-4-sulfonic acid and 1,2-naphthoquinonediazide-5-sulfonic acid. Because of this, it is possible to improve the sensitivity and resolution of the positive photosensitive resin composition higher than conventional photosensitive compositions.

The reason is assumed to be as follows.

Considering a photosensitive agent in which all of the hydroxyl groups of the phenolic compound represented by the formula (2) are substituted with an ester of 1,2-naphthoquinonediazide sulfonic acid, which is a photosensitive group, the photosensitive agent (B) of the present invention is characterized in that the distance between a photosensitive group (a) which is present in an aromatic ring (a) that is one of the four aromatic rings, and a photosensitive group (b) which is present in an aromatic ring (b) that is the other ring connected to, as a result of substitution, a site of the cyclohexyl structure, which is the same as the site to which the aromatic ring (a) is connected (that is, the distance between the photosensitive groups (a) and (b)) is short, while the distance between the photosensitive group (a) and a photosensitive group (c) or (d), each of which is diagonally opposite to the photosensitive group (a) through an organic group (Z) (that is, the distance between the photosensitive groups (a) and (c) and between the photosensitive groups (a) and (d)), is very long; therefore, the phenolic compound represented by the formula (2) is found to have a large molecular weight and the structure having such a position of the photosensitive groups is unique.

The distance between the photosensitive groups in the photosensitive agent (B), which are diagonally opposite to each other through the organic group Z, is longer than conventional photosensitive agents, so that interaction with polyamide resins in a wide area can be caused efficiently. As a result, the resistance of the unexposed portion to alkaline aqueous solutions is increased, resulting in an improvement in the resolution of the positive photosensitive resin composition.

On the other hand, in the exposed portion, since the photosensitive agent (B) has the cyclohexyl structure, the photosensitive agent itself absorbs less actinic radiation. As a result, a large amount of light reaches the bottom of the coating film; therefore, photosensitive groups that are close to the substrate is more likely to cause chemical change and the production of the carboxyl acid group is more likely to occur. In addition, the photosensitive agent (B) contains a structure in which the distance between the photosensitive groups through the same substitution site of the cyclohexyl structure is short, so that the areas show a high carboxylic acid concentration. Such a structure with a high carboxylic acid concentration is arranged at the both ends, so that the solubility of the photosensitive agent (B) in developers is increased even though the photosensitive agent (B) has a large molecular weight. It is considered that the photosensitive agent in the coating film is then dissolved and removed, resulting in the entrance of a developer into a hollow space thus obtained. However, because of the large molecular weight of the photosensitive agent (B), a large amount of developer enters, so that the resin is likely to collapse and it is easy to remove the resin in the exposed portion; therefore, compared to photosensitive agents having a similar molecular weight, the photosensitive agent (B) is able to shorten the developing time while being highly sensitive, and is able to shorten the throughput time in not only the exposure step but also the developing step. Moreover, scum production is reduced due to the above reason.

The photosensitive agent (B) is obtained by the esterification of a phenolic compound represented by the formula (2) with at least one of 1,2-naphthoquinonediazide-4-sulfonic acid and 1,2-naphthoquinonediazide-5-sulfonic acid. Among the four hydroxyl groups of the phenolic compound represented by the formula (2), at least one is esterified with 1,2-naphthoquinonediazide-4-sulfonic acid or 1,2-naphthoquinonediazide-5-sulfonic acid.

[Chemical Formula 21]

Formula (2)

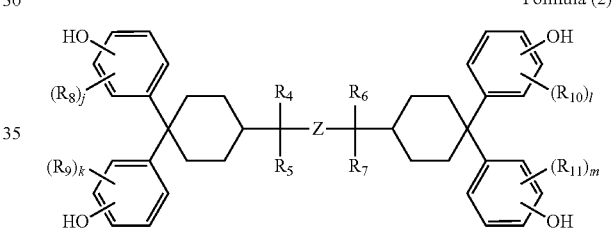

In the formula, z is an organic group; each of $R_4$ to $R_7$ is a hydrogen atom or an alkyl group; each of $R_8$ to $R_{11}$ is a hydrogen atom, a hydroxyl group, a halogen atom, an alkyl group, an alkoxy group, an alkenyl group or a cycloalkyl group; each of j to m is an integer from 0 to 4; and when there are plurality of $R_8$s, $R_9$s, $R_{10}$s or $R_{11}$s, they may be the same or different from each other.

In the formula (2), Z is an organic group and is not particularly limited; however, examples thereof include the structures represented by the following formula (16), that is, the following formulae (16-1) to (16-5). Of these, the formulae (16-3) and (16-4) are particularly preferred, so that there is a further improvement in the sensitivity and resolution of the positive photosensitive resin composition.

[Chemical Formula 22]
Formula (16)

—$(CH_2)_p$—  Formula (16-1)

—$C(CH_3)_2$—  Formula (16-2)

Formula (16-3)

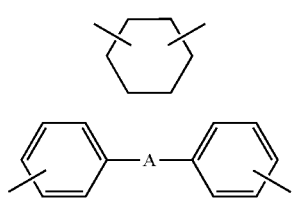

In the formulae, A is —CH$_2$—, —CH(CH$_3$)—, —C(CH$_3$)$_2$—, —O—, —S—, —SO$_2$—, —CO—, —NHCO—, —C(CF$_3$)$_2$— or a single bond, and p is an integer of 1 to 10.

Also in the formula (2), each of R$_4$ to R$_7$ is a hydrogen atom or an alkyl group and is not particularly limited. Examples of the alkyl group include a methyl group, an ethyl group, a propyl group, a butyl group, a pentyl group, a hexyl group, a heptyl group, an octyl group, a nonyl group, a decyl group, an undecyl group and a dodecyl group. They may be the same or different from each other. Of these, a hydrogen atom, a methyl group and an ethyl group are especially preferred, so that the positive photosensitive resin composition shows excellent sensitivity and resolution.

In the formula (2), each of R$_8$ to R$_{11}$ is one selected from a hydrogen atom, a hydroxyl group, a halogen atom, an alkyl group, an alkoxy group, an alkenyl group and a cycloalkyl group, and they may be the same or different from each other. Examples of the halogen atom include chlorine and bromine. Examples of the alkyl group include a methyl group, an ethyl group, a propyl group, a butyl group, a pentyl group, a hexyl group, a heptyl group, an octyl group, a nonyl group, a decyl group, an undecyl group and a dodecyl group. Examples of the alkoxy group include a methoxy group, an ethoxy group, a propoxy group and a butoxy group. Examples of the alkenyl group include an ethenyl group, a propenyl group and a butenyl group. Examples of the cycloalkyl group include a cyclopropyl group, a cyclobutyl group, a cyclopentyl group and a cyclohexyl group. Of these, a hydrogen atom, a methyl group and an ethyl group are particularly preferred, so that the positive photosensitive resin composition shows excellent sensitivity and resolution. Also in the formula (2), each of j to m is an integer from 0 to 4.

The phenolic compound represented by the formula (2) is not particularly limited and specific examples thereof include those represented by the following formula (17), that is, the formulae (17-1) to (17-14).

[Chemical Formula 23]
Formula (17)-(1/2)

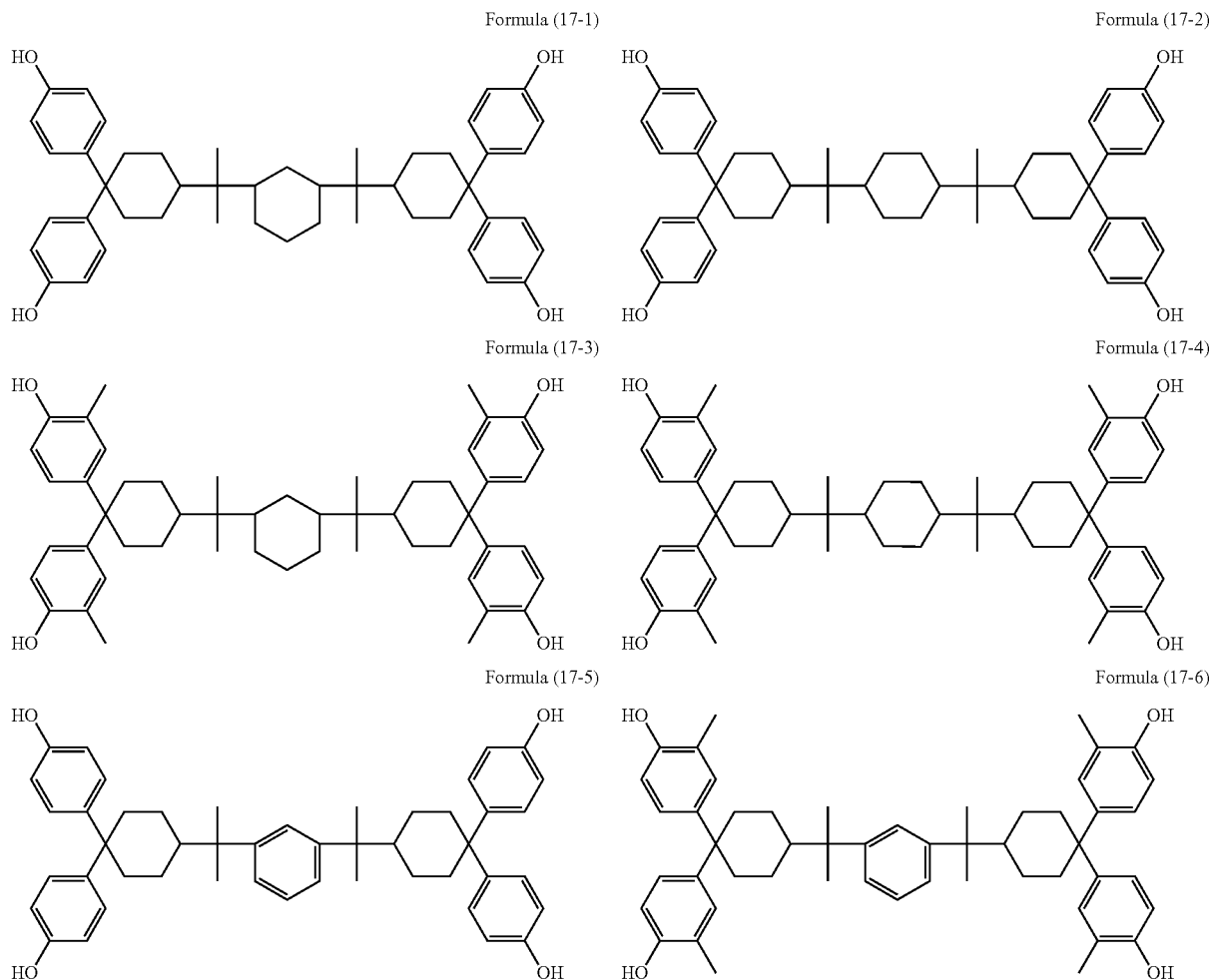

-continued
Formula (17-7)
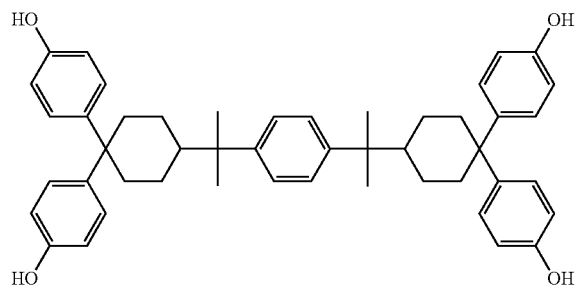
Formula (17-8)
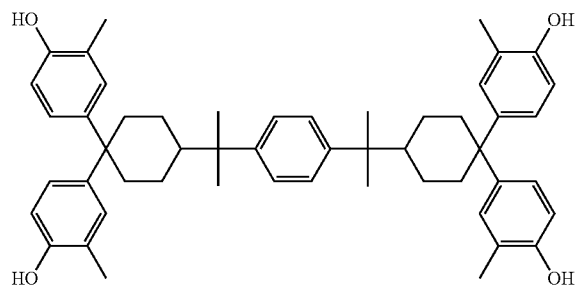
[Chemical Formula 24]
Formula (17)-(2/2)
Formula (17-9)
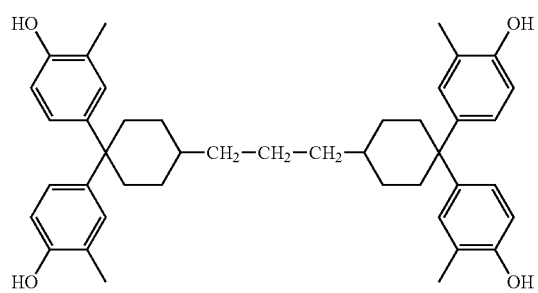
Formula (17-10)
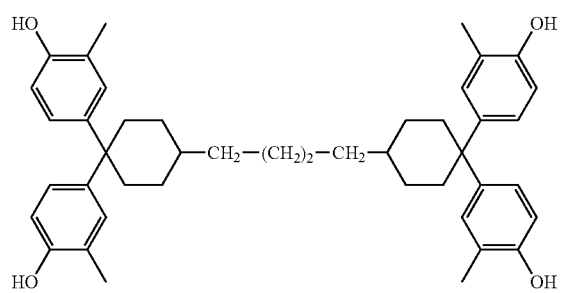
Formula (17-11)
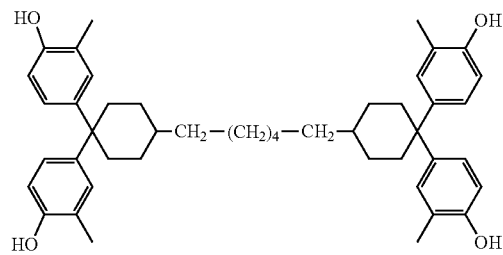
Formula (17-12)
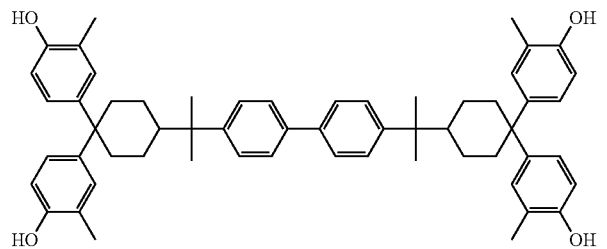
Formula (17-13)
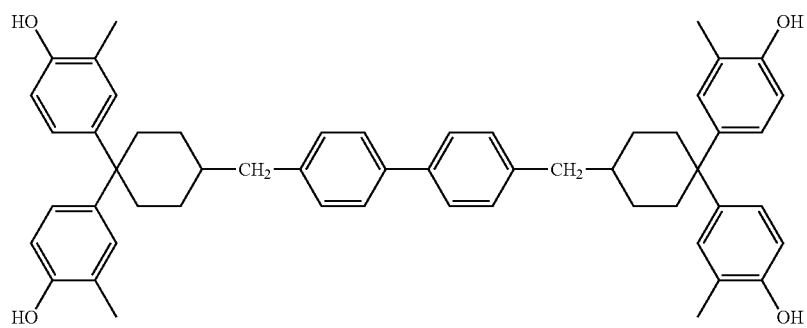
Formula (17-14)
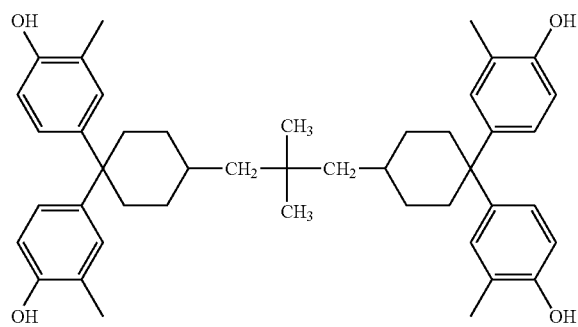

Of these, phenolic compounds represented by the following formula (5), that is, the formulae (5-1) to (5-5) are preferred, so that the positive photosensitive resin composition shows excellent sensitivity and resolution.

[Chemical Formula 25]
Formula (5)

Formula (5-1)

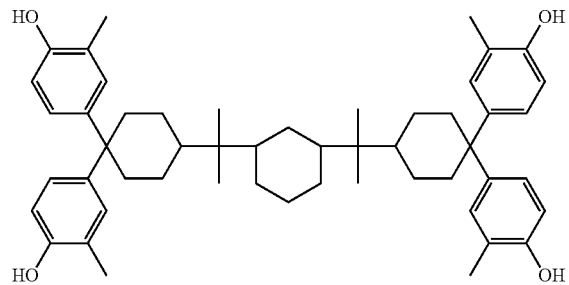

Formula (5-2)

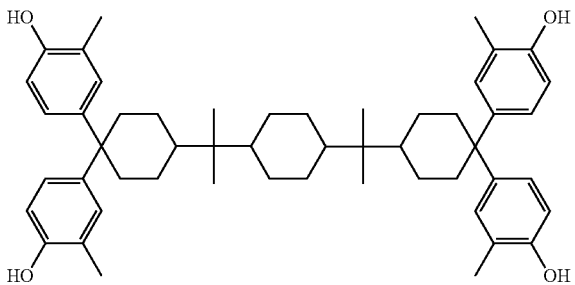

Formula (5-3)

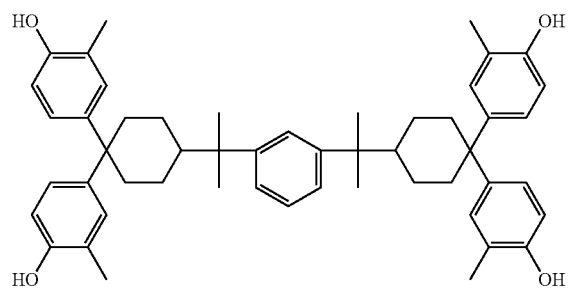

Formula (5-4)

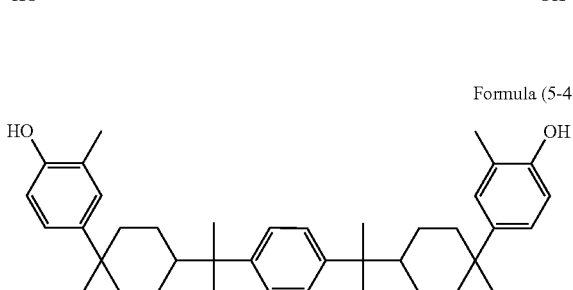

Formula (5-5)

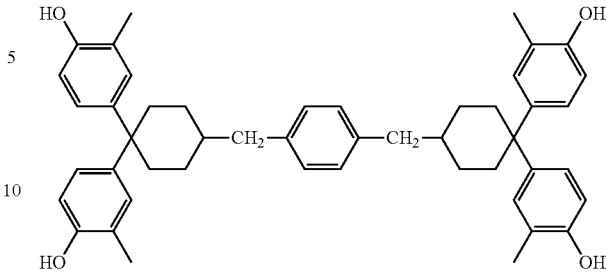

In the formula (2), each of $R_8$ to $R_{11}$ is more preferably a methyl group or ethyl group, so that compared to the case of hydrogen atom, there is an improvement in the resolution of the positive photosensitive resin composition with maintaining the sensitivity of the same. The reason is not clear but is assumed to be as follows. In the case of methyl or ethyl group, the size of the functional group is not so large. During development, therefore, in the exposed portion, the photosensitive group does not sterically inhibit the reaction of a chemically-changed carboxylic acid from the photosensitive group with an alkaline aqueous solution component; meanwhile, in the unexposed portion, there is an increase in the number of alkyl groups, resulting in an increase in hydrophobicity. Also, it is clear from computational chemistry that the electron density of the carbon atom of the methyl group, and in the case of ethyl group, the electron density of the carbon atom which is not connected to the aromatic ring and faces outward, are the same as the electron density of the unsubstituted ortho position of the hydroxyl group. Therefore, it is considered that photosensitive groups are likely to sterically interact with each other, so that the ability of the dissolution inhibition is increased and dissolution contrast between the exposed and unexposed portions is thus increased, resulting in an increase in the resolution of the positive photosensitive resin composition.

The content of the photosensitive agent (B) is not particularly limited. With respect to the polyamide resin (A) of 100 parts by weight, it is preferably 1 to 50 parts by weight, particularly preferably 10 to 40 parts by weight. When the content is in the range, a positive photosensitive resin composition is obtained, which produces no scum and shows excellent sensitivity and resolution.

To be highly sensitive and to inhibit scum production upon patterning, the positive photosensitive resin composition of the present invention can further contain a compound having a phenolic hydroxyl group.

Examples of the specific structure of the compound include those represented by the formula (18), that is, the formulae (18-1) to (18-3). They can be used alone or in combination of two or more.

[Chemical Formula 26]
Formula (18)

Formula (18-1)

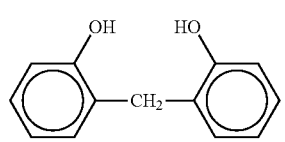

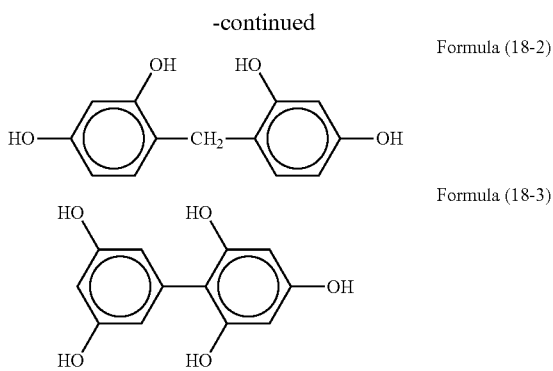

Formula (18-2)

Formula (18-3)

The content of the compound having a phenolic hydroxyl group is not particularly limited. With respect to the polyamide resin (A) of 100 parts by weight, it is preferably 1 to 30 parts by weight, more preferably 1 to 20 parts by weight. When the content is in the range, it is able to inhibit scum production further during development and dissolution of the exposed portion is promoted, so that there is an improvement in the sensitivity of the positive photosensitive resin composition.

As needed, the positive photosensitive resin composition of the present invention can also contain additives such as an acrylic-type leveling agent, a silicon-containing leveling agent, a fluorine-containing leveling agent, a vinyl-type leveling agent, and a silane coupling agent.

Examples of the silane coupling agent include, but not limited to, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, 3-mercaptopropylmethyldimethoxysilane, 3-mercaptopropyltrimethoxysilane, bis(triethoxypropyl) tetrasulfide, 3-isocyanatepropyltriethoxysilane, and silane coupling agents obtained by the reaction of a silicon compound having an amino group with an acid dianhydride or acid anhydride.

The silicon compound having an amino group is not particularly limited and examples thereof include 3-aminopropyltrimethoxysilane, N-2-(aminoethyl)-3-aminopropyltrimethoxysilane, 3-aminopropylmethyldimethoxysilane, N-2-(aminoethyl)-3-aminopropyltriethoxysilane, and 3-aminopropyltriethoxysilane.

In the present invention, these components are dissolved in a solvent and used in the form of varnish. Examples of the solvent include N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, and methyl-3-methoxypropionate. They can be used alone or in combination of two or more.

The method for using the positive photosensitive resin composition of the present invention is as follows. First, the composition is applied to an appropriate support (substrate) such as a silicon wafer, a ceramic substrate and an aluminum substrate. The applied amount is, when applied to a semiconductor chip, an amount that forms a film having a final thickness of 0.1 to 30 μm after curing. If the thickness is less than the lower limit, it is difficult for the film to fully function as the surface protection film of the semiconductor chip. If more than the upper limit, not only it is difficult to obtain a fine processing pattern, but also it takes a long processing time, resulting in a low throughput. Examples of the method for applying the composition include spin coating using a spinner, spray coating using a spray coater, immersion, printing and roll coating. Next, the coated film is dried by pre-baking at 60 to 130° C. and then exposed to actinic radiation in a desired pattern. As the actinic radiation, X-rays, electron beams, ultraviolet radiation, visible radiation or the like can be used. Preferred is one having a wavelength of 200 to 500 nm.

Then, the exposed portion is dissolved and removed with a developer to obtain a relief pattern. As the developer, an aqueous solution of an alkali can be suitably used, examples of the alkali including inorganic alkalis such as sodium hydroxide, potassium hydroxide, sodium carbonate, sodium silicate, sodium metasilicate and ammonia water, primary amines such as ethylamine and n-propylamine, secondary amines such as diethylamine and di-n-propylamine, tertiary amines such as triethylamine and methyldiethylamine, alcohol amines such as dimethylethanolamine and triethanolamine, and quaternary ammonium salts such as tetramethyl ammonium hydroxide and tetraethyl ammonium hydroxide. Also, an aqueous solution produced by adding an appropriate amount of water-soluble organic solvent or surfactant to said aqueous solution can be suitably used as the developer, examples of the solvent including alcohols such as methanol and ethanol. As the development method, spraying, paddling, immersion, sonication, etc., can be used.

Next, the relief pattern formed by the development is rinsed. Distilled water is used as the rinsing solution. Next, a heat treatment is performed on the pattern to form an oxazole ring, an imide ring, or both of them, thereby obtaining a final pattern with excellent heat resistance.

The heat treatment temperature is preferably 180° C. to 380° C., more preferably 200° C. to 350° C. The heat treatment performed here is the above-described heat treatment process.

(2) Cured Film, Protecting Film and Insulating Film

Next, the cured film formed with the positive photosensitive resin composition of the present invention will be described. The cured film is a cured product of the positive photosensitive resin composition. It is useful for not only semiconductor devices such as a semiconductor chip, but also for display devices such as a TFT liquid crystal display and an organic EL display. It is also useful as the interlayer insulation film of a multilayered circuit, the cover coat of a flexible copper-clad board, a solder resist film, and a liquid crystal alignment film.

Examples of the applications to semiconductor devices include the following: a passivation film which is the aforementioned cured film of the positive photosensitive resin composition that is formed on a semiconductor chip to protect metal wiring from corrosion due to water entering from the outside of the semiconductor chip or ionic impurities contained in molding compounds for encapsulation; a protecting film such as a buffer coating film, which is the aforementioned cured film of the positive photosensitive resin composition that is formed on a passivation film to protect metal wiring from physical damage due to a filler contained in the molding compounds for encapsulation or to reduce the transformation of metal wiring by shear stress which is induced by the difference in coefficient of thermal expansion (CTE) between the molding compound for encapsulation and substrate; an insulating film such as an interlayer insulation film, which is the aforementioned cured film of the positive photosensitive resin composition that is formed on a circuit formed on a semiconductor chip; an α-ray shielding film for preventing soft errors due to α-rays emitted from a minute amount of radioactive substance contained in the molding compounds for encapsulation; a planarizing film; a projection (resin post) used for producing a wafer level chip size package (W-CSP); and a barrier rib.

Examples of the applications to display devices include a protecting film which is the cured film of the positive photosensitive resin composition that is formed on a display chip; an insulating film or planarizing film for TFT chips, color filters, etc.; a projection for MVA-type liquid crystal displays, etc.; and a barrier rib for organic EL chip cathodes, etc. The positive photosensitive resin composition is used in such a manner that according to the intended use of a semiconductor device, a patterned layer of the positive photosensitive resin composition is formed on a substrate on which a display chip or color filter is formed. High transparency is required particularly for an insulating film or planarizing film of display devices. The positive photosensitive resin composition is able to form a resin layer with excellent transparency by employing a post-exposure step before curing the layer of the positive photosensitive resin composition, so that it is practically more preferable.

EXAMPLES

The present invention will be described in detail by way of examples. The scope of the present invention is not limited to the examples, however.

Example 1

Synthesis of Polyamide Resin (A-1)

A dicarboxylic acid derivative (active ester) of 443.21 g (0.900 mol) and hexafluoro-2,2-bis(3-amino-4-hydroxyphenyl)propane of 366.26 g (1.000 mol) were put in a four-neck separable flask equipped with a thermometer, stirrer, raw material inlet and dry nitrogen gas feed pipe, the derivative being obtained by the reaction of diphenyl ether-4,4'-dicarboxylic acid of 0.900 mol with 1-hydroxy-1,2,3-benzotriazole of 1.800 mol. N-methyl-2-pyrrolidone of 3,200 g was added to dissolve them. The mixture was reacted at 75° C. for 12 hours with an oil bath.

Next, 34.43 g (0.200 mol) of 4-ethynylphthalic anhydride dissolved in 100 g of N-methyl-2-pyrrolidone was added thereto and the mixture was stirred for another 12 hours to complete the reaction. After filtering the reaction mixture, the reaction mixture was poured into a mixed solution of water and isopropanol at 3:1 (volume ratio). The resulting precipitate was collected by filtration, washed sufficiently with water, and dried under vacuum to obtain the target polyamide resin (A-1) having a number average molecular weight of 11,500.

[Synthesis of Photosensitive Agent]

Phenol represented by the following formula (B-1) of 18.78 g (0.025 mol) and triethylamine of 8.40 g (0.083 mol) were put in a four-neck separable flask equipped with a thermometer, stirrer, raw material inlet and dry nitrogen gas feed pipe. Tetrahydrofuran of 145 g was added to dissolve them. After cooling the reaction solution to 10° C. or less, 1,2-naphthoquinone-2-diazide-4-sulfonyl chloride of 22.30 g (0.083 mol) and tetrahydrofuran of 100 g were gradually added drop-wise, keeping the temperature at less than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-1).

[Chemical Formula 27]

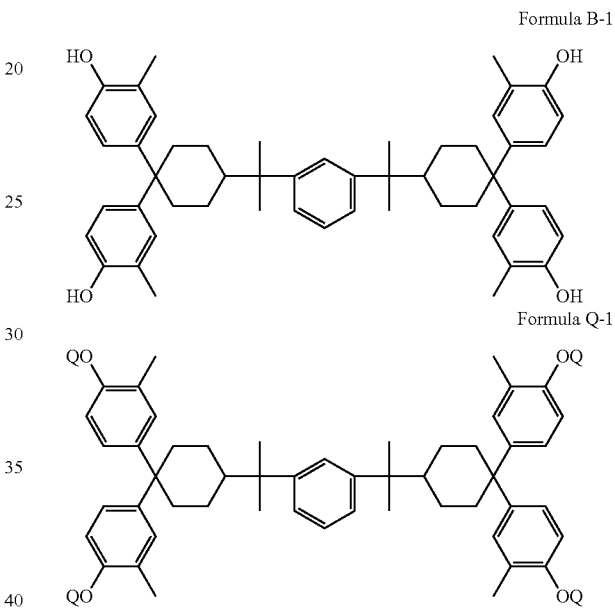

Formula B-1

Formula Q-1

In the formula, Q represents a hydrogen atom or 1,2-naphthoquinone-2-diazide-4-sulfonic acid group and 83% of the Qs are 1,2-naphthoquinone-2-diazide-4-sulfonic acid groups.

[Production of Positive Photosensitive Resin Composition]

The thus-synthesized polyamide resin (A-1) of 100 g, the photosensitive diazoquinone compound represented by the formula (Q-1) of 15 g, and a silicon compound having a structure represented by the following formula (C-1) of 18 g were dissolved in γ-butyrolactone of 150 g. Then, the mixture was filtered with a Teflon (trademark) filter having a pour diameter of 0.2 μm to obtain a positive photosensitive resin composition.

[Chemical Formula 28]

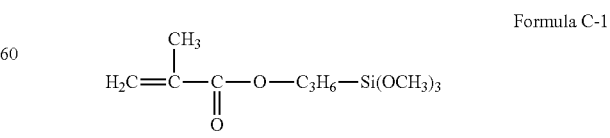

Formula C-1

[Evaluation of Photosensitive Characteristics]

The positive photosensitive resin composition was applied on a silicon wafer with a spin coater and then pre-baked on a hot plate at 120° C. for four minutes to obtain a coating film having a thickness of about 8.0 μm. Using an i-line stepper (4425i manufactured by NIKON Corporation), the coating film was exposed to i-line radiation of from 100 mJ/cm² to 780 mJ/cm² in increments of 10 mJ/cm² through a mask manufactured by Toppan Printing Co., Ltd. (Test Chart No. 1, a mask on which negative- and positive patterns having a width of 0.88 to 50 μm are drawn).

Next, puddle development was performed thereon with a 2.38% tetramethylammonium hydroxide aqueous solution, controlling the developing time so that the difference between the film thickness of an unexposed portion of the coating film after the prebaking and the film thickness of the same after the development is 1 μm. Then, the coating film was rinsed with pure water for 10 seconds. As a result, it was found that a pattern was formed in a portion which was exposed to the radiation at an exposure amount of 250 mJ/cm² or more (the sensitivity was 250 mJ/cm²). At this time, the resolution was as high as 5 μm.

Comparative Example 1

Synthesis of Photosensitive Agent

Phenol represented by the following formula (B-2) of 11.41 g (0.050 mol) and triethylamine of 8.40 g (0.083 mol) were put in a four-neck separable flask equipped with a thermometer, stirrer, raw material inlet and dry nitrogen gas feed pipe. Acetone of 100 g was added to dissolve them. After cooling the reaction solution to 10° C. or less, 1,2-naphthoquinone-2-diazide-4-sulfonyl chloride of 22.30 g (0.083 mol) and tetrahydrofuran of 100 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-2).

[Production of Positive Photosensitive Resin Composition and Evaluation of Photosensitive Characteristics]

Next, a positive photosensitive resin composition was obtained in the same manner as Example 1 except that the photosensitive diazoquinone compound represented by the formula (Q-1) was changed to one represented by the formula (Q-2). The positive photosensitive resin composition was evaluated in the same manner as Example 1.

As a result, the sensitivity was 480 mJ/cm² and the resolution was as low as 9 μm at this time.

[Chemical Formula 29]

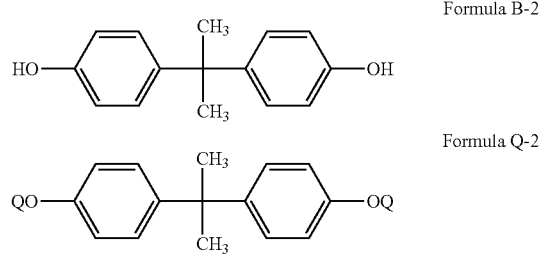

Formula B-2

Formula Q-2

In the formula, Q represents a hydrogen atom or 1,2-naphthoquinone-2-diazide-4-sulfonic acid group and 83% of the Qs are 1,2-naphthoquinone-2-diazide-4-sulfonic acid groups.

TABLE 1

| | Resin (Common) | Photo-sensitive Agent | Sensitivity | Resolution |
|---|---|---|---|---|
| Example 1 | (A-1) | (Q-1) | 250 mJ/cm² | 5 μm |
| Comparative Example 1 | (A-1) | (Q-2) | 480 mJ/cm² | 9 μm |

Example 2

Synthesis of Polyamide Resin (A-2)

A dicarboxylic acid derivative (active ester) of 408.74 g (0.830 mol) and hexafluoro-2,2-bis(3-amino-4-hydroxyphenyl)propane of 366.26 g (1.000 mol) were put in a four-neck separable flask equipped with a thermometer, stirrer, raw material inlet and dry nitrogen gas feed pipe, the derivative being obtained by the reaction of diphenyl ether-4,4'-dicarboxylic acid of 0.830 mol with 1-hydroxy-1,2,3-benzotriazole of 1.660 mol. N-methyl-2-pyrrolidone of 3,100 g was added to dissolve them. The mixture was reacted at 75° C. for 16 hours with an oil bath.

Next, 69.77 g (0.425 mol) of 5-norbornene-2,3-dicarboxylic anhydride dissolved in 280 g of N-methyl-2-pyrrolidone was added thereto and the mixture was stirred for three hours to complete the reaction. After filtering the reaction mixture, the reaction mixture was poured into a mixed solution of water and isopropanol at 3:1 (volume ratio). The resulting precipitate was collected by filtration, washed sufficiently with water, and dried under vacuum to obtain the target polyamide resin (A-2) having a number average molecular weight of 8,700.

[Synthesis of Photosensitive Agent]

Phenol represented by the following formula (B-1) of 18.78 g (0.025 mol) and triethylamine of 7.59 g (0.075 mol) were put in a four-neck separable flask equipped with a thermometer, stirrer, raw material inlet and dry nitrogen gas feed pipe. Tetrahydrofuran of 140 g was added to dissolve them. After cooling the reaction solution to 10° C. or less, 1,2-naphthoquinone-2-diazide-4-sulfonyl chloride of 20.15 g (0.075 mol) and tetrahydrofuran of 100 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-3).

[Chemical Formula 30]

Formula B-1

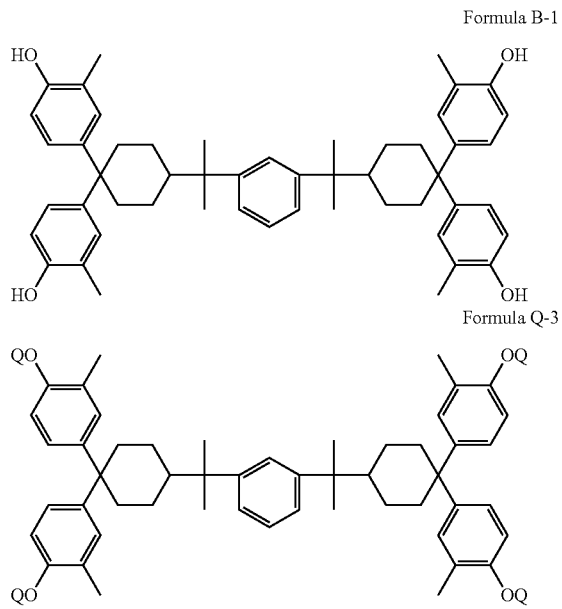

Formula Q-3

In the formula, Q represents a hydrogen atom or 1,2-naphthoquinone-2-diazide-4-sulfonic acid group and 75% of the Qs are 1,2-naphthoquinone-2-diazide-4-sulfonic acid groups.

[Production of Positive Photosensitive Resin Composition]

The thus-synthesized polyamide resin (A-2) of 100 g, the photosensitive diazoquinone compound having a structure represented by the formula (Q-3) of 20 g, and a silicon compound having a structure represented by the formula (C-1) of 8 g were dissolved in γ-butyrolactone of 150 g. Then, the mixture was filtered with a Teflon (trademark) filter having a pour diameter of 0.2 μm to obtain a positive photosensitive resin composition.

[Evaluation of Photosensitive Characteristics]

The positive photosensitive resin composition was applied on a silicon wafer with a spin coater and then pre-baked on a hot plate at 120° C. for four minutes to obtain a coating film having a thickness of about 8.0 μm. Using an i-line stepper (4425i manufactured by NIKON Corporation), the coating film was exposed to i-line radiation of from 100 mJ/cm² to 780 mJ/cm² in increments of 10 mJ/cm² through a mask manufactured by Toppan Printing Co., Ltd. (Test Chart No. 1, a mask on which negative and positive patterns having a width of 0.88 to 50 μm are drawn).

Next, puddle development was performed twice thereon with a 2.38% tetramethylammonium hydroxide aqueous solution, controlling the developing time so that the difference between the film thickness of an unexposed portion of the coating film after the prebaking and the film thickness of the same after the development is 1 μm. Then, the coating film was rinsed with pure water for 10 seconds. As a result, it was found that when the developing time is 45 seconds×twice, the difference between the film thicknesses of an unexposed portion of the coating film after the prebaking and the film thickness of the same after the development is 1 μm; moreover, a pattern was formed in a portion which was exposed to the radiation at an exposure amount of 210 mJ/cm² or more (the sensitivity was 210 mJ/cm²). No scum was found around the openings. At this time, the resolution was as high as 4 μm.

Comparative Example 2

Synthesis of Photosensitive Agent

Phenol represented by the following formula (B-3) of 15.82 g (0.025 mol) and triethylamine of 7.59 g (0.075 mol) were put in a four-neck separable flask equipped with a thermometer, stirrer, raw material inlet and dry nitrogen gas feed pipe. Tetrahydrofuran of 120 g was added to dissolve them. After cooling the reaction solution to 10° C. or less, 1,2-naphthoquinone-2-diazide-4-sulfonyl chloride of 20.15 g (0.075 mol) and tetrahydrofuran of 100 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-5).

[Chemical Formula 31]

Formula B-3

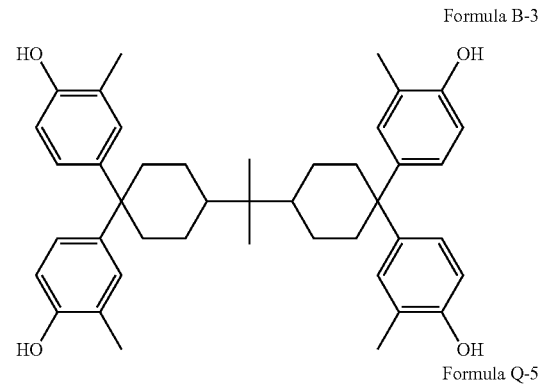

Formula Q-5

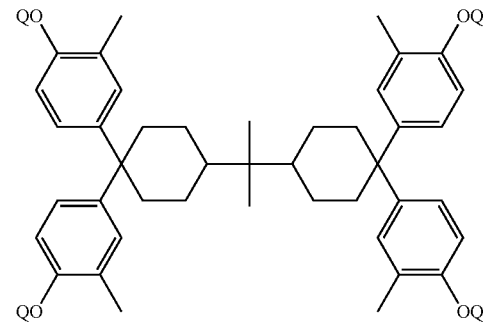

In the formula, Q represents a hydrogen atom or 1,2-naphthoquinone-2-diazide-4-sulfonic acid group and 75% of the Qs are 1,2-naphthoquinone-2-diazide-4-sulfonic acid groups.

[Production of Positive Photosensitive Resin Composition and Evaluation of Photosensitive Characteristics]

Next, a positive photosensitive resin composition was obtained in the same manner as Example 2 except that the photosensitive diazoquinone compound represented by the formula (Q-3) was changed to one represented by the formula (Q-5). The positive photosensitive resin composition was evaluated in the same manner as Example 2.

As a result, it was found that when the developing time is 60 seconds×twice, the difference between the film thicknesses of an unexposed portion of the coating film after the prebaking and the film thickness of the same after the development is 1 μm; moreover, the sensitivity was 260 mJ/cm². Scum was found around the openings. At this time, the resolution was as low as 25 μm.

Comparative Example 3

Synthesis of Photosensitive Agent

Phenol represented by the following formula (B-4) of 19.77 g (0.030 mol) and triethylamine of 6.83 g (0.068 mol) were put in a four-neck separable flask equipped with a thermometer, stirrer, raw material inlet and dry nitrogen gas feed pipe. Tetrahydrofuran of 200 g was added to dissolve them. After cooling the reaction solution to 10° C. or less, 1,2-naphthoquinone-2-diazide-4-sulfonyl chloride of 18.14 g (0.068 mol) and tetrahydrofuran of 100 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-7).

[Chemical Formula 32]

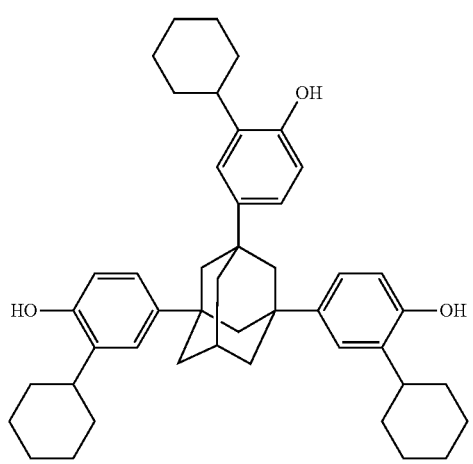

Formula B-4

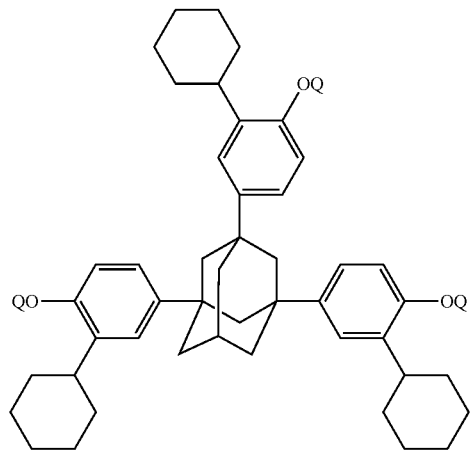

Formula Q-7

In the formula, Q represents a hydrogen atom or 1,2-naphthoquinone-2-diazide-4-sulfonic acid group and 75% of the Qs are 1,2-naphthoquinone-2-diazide-4-sulfonic acid groups.

[Production of Positive Photosensitive Resin Composition and Evaluation of Photosensitive Characteristics]

Next, a positive photosensitive resin composition was obtained in the same manner as Example 2 except that the photosensitive diazoquinone compound represented by the formula (Q-3) was changed to one represented by the formula (Q-7). The positive photosensitive resin composition was evaluated in the same manner as Example 2.

As a result, it was found that when the developing time is 64 seconds×twice, the difference between the film thicknesses of an unexposed portion of the coating film after the prebaking and the film thickness of the same after the development is 1 μm; moreover, the sensitivity was 300 mJ/cm². Scum was found around the openings. At this time, the resolution was as low as 20 μm.

TABLE 2

| | Resin (Common) | Photo-sensitive Agent | Sensitivity | Resolution | Scum |
|---|---|---|---|---|---|
| Example 2 | (A-2) | (Q-3) | 210 mJ/cm² | 4 μm | No |
| Comparative Example 2 | (A-2) | (Q-5) | 260 mJ/cm² | 25 μm | Yes |
| Comparative Example 3 | (A-2) | (Q-7) | 300 mJ/cm² | 20 μm | Yes |

Example 3

Synthesis of Polyamide Resin (A-3)

A dicarboxylic acid derivative (active ester) of 364.39 g (0.800 mol), 4,4'-methylenebis(2-amino-3,6-dimethylphenol) of 186.14 g (0.650 mol) and 3,3'-diamino-4,4'-dihydroxydiphenylmethane of 80.59 g (0.350 mol) were put in a four-neck separable flask equipped with a thermometer, stirrer, raw material inlet and dry nitrogen gas feed pipe, the derivative being obtained by the reaction of isophthalic acid of 0.320 mol, diphenyl ether-4,4'-dicarboxylic acid of 0.480 mol and 1-hydroxy-1,2,3-benzotriazole of 1.600 mol. N-methyl-2-pyrrolidone of 2,520 g was added to dissolve them. The mixture was reacted at 75° C. for 16 hours with an oil bath.

Next, 86.07 g (0.500 mol) of 4-ethynylphthalic anhydride dissolved in 340 g of N-methyl-2-pyrrolidone was added thereto and the mixture was stirred for 3 hours to complete the reaction. After filtering the reaction mixture, the reaction mixture was poured into a mixed solution of water and isopropanol at 3:1 (volume ratio). The resulting precipitate was collected by filtration, washed sufficiently with water, and dried under vacuum to obtain the target polyamide resin (A-3) having a number average molecular weight of 7,500.

[Synthesis of Photosensitive Agent]

Phenol represented by the following formula (B-1) of 18.78 g (0.025 mol) and triethylamine of 10.12 g (0.100 mol) were put in a four-neck separable flask equipped with a thermometer, stirrer, raw material inlet and dry nitrogen gas feed pipe. Tetrahydrofuran of 160 g was added to dissolve them. After cooling the reaction solution to 10° C. or less, 1,2-naphthoquinone-2-diazide-4-sulfonyl chloride of 26.87 g (0.100 mol) and tetrahydrofuran of 120 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-4).

[Chemical Formula 33]

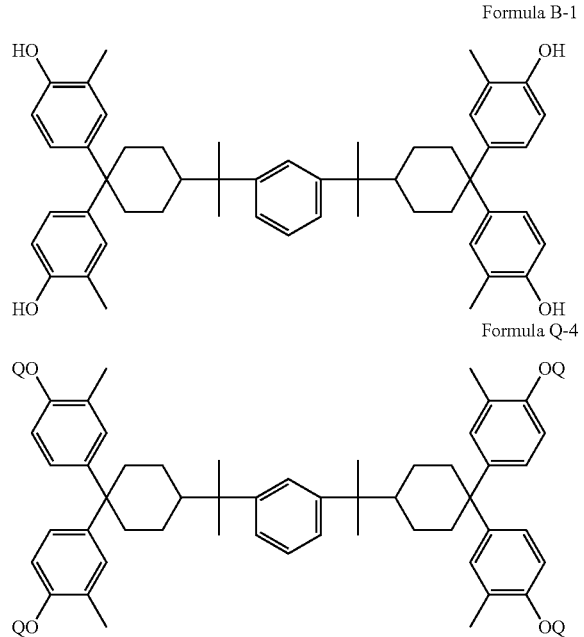

Formula B-1

Formula Q-4

In the formula, Q represents a 1,2-naphthoquinone-2-diazide-4-sulfonic acid group and 100% of the Qs are 1,2-naphthoquinone-2-diazide-4-sulfonic acid groups.

[Production of Positive Photosensitive Resin Composition]

The thus-synthesized polyamide resin (A-3) of 100 g, the photosensitive diazoquinone compound having a structure represented by the formula (Q-4) of 18 g, and a silicon compound having a structure represented by the formula (C-1) of 8 g were dissolved in γ-butyrolactone of 200 g. Then, the mixture was filtered with a Teflon (trademark) filter having a pour diameter of 0.2 μm to obtain a positive photosensitive resin composition.

[Evaluation of Photosensitive Characteristics]

The positive photosensitive resin composition was evaluated in the same manner as Example 2 except that the developing time was controlled so that the difference between the film thickness of an unexposed portion of the coating film after the prebaking and the film thickness of the same after the development is 2 μm. As a result, it was found that when the developing time is 26 seconds×twice, the difference between the film thicknesses of the unexposed portion of the coating film after the prebaking and the film thickness of the same after the development is 2 μm; moreover, the sensitivity was 200 mJ/cm². No scum was found around the openings. At this time, the resolution was as high as 3 μm.

Comparative Example 4

Synthesis of Photosensitive Agent

Phenol represented by the following formula (B-3) of 15.82 mol) and triethylamine of 10.12 g (0.100 mol) were put in a four-neck separable flask equipped with a thermometer, stirrer, raw material inlet and dry nitrogen gas feed pipe. Tetrahydrofuran of 160 g was added to dissolve them. After cooling the reaction solution to 10° C. or less, 1,2-naphthoquinone-2-diazide-4-sulfonyl chloride of 26.87 g (0.100 mol) and tetrahydrofuran of 100 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-6).

[Chemical Formula 34]

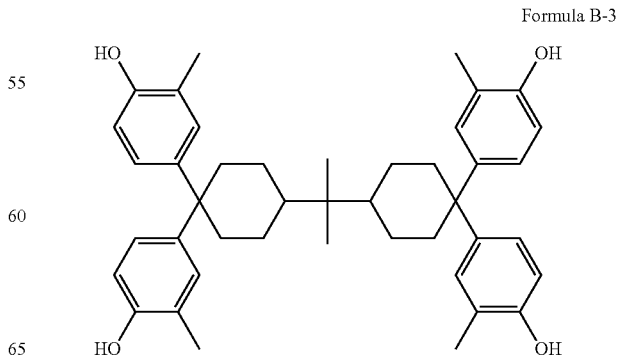

Formula B-3

Formula Q-6

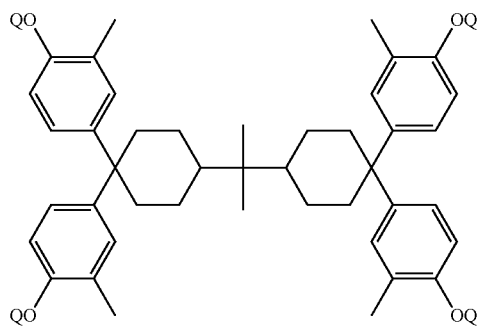

In the formula, Q represents a 1,2-naphthoquinone-2-diazide-4-sulfonic acid group and 100% of the Qs are 1,2-naphthoquinone-2-diazide-4-sulfonic acid groups.

[Production of Positive Photosensitive Resin Composition and Evaluation of Photosensitive Characteristics]

Next, a positive photosensitive resin composition was obtained in the same manner as Example 3 except that the photosensitive diazoquinone compound represented by the formula (Q-4) was changed to one represented by the formula (Q-6). The positive photosensitive resin composition was evaluated in the same manner as Example 3.

As a result, it was found that when the developing time is 36 seconds×twice, the difference between the film thicknesses of an unexposed portion of the coating film after the prebaking and the film thickness of the same after the development is 2 μm; moreover, the sensitivity was 240 mJ/cm². Scum was found around the openings. At this time, the resolution was as low as 20 μm.

Comparative Example 5

Synthesis of Photosensitive Agent

Phenol represented by the following formula (B-4) of 19.77 g (0.030 mol) and triethylamine of 9.11 g (0.090 mol) were put in a four-neck separable flask equipped with a thermometer, stirrer, raw material inlet and dry nitrogen gas feed pipe. Tetrahydrofuran of 230 g was added to dissolve them. After cooling the reaction solution to 10° C. or less, 1,2-naphthoquinone-2-diazide-4-sulfonyl chloride of 24.18 g (0.090 mol) and tetrahydrofuran of 120 g were gradually added drop-wise, keeping the temperature at more than 10° C. The mixture was stirred for five minutes at 10° C. or less and then for five hours at room temperature to complete the reaction. After filtering the reaction mixture, the reaction mixture was poured into a solution of water and methanol at 3:1 (volume ratio). The resulting precipitate was collected by filtration, washed sufficiently with water and dried under vacuum to obtain a photosensitive diazoquinone compound represented by the following formula (Q-8).

[Chemical Formula 35]

Formula B-4

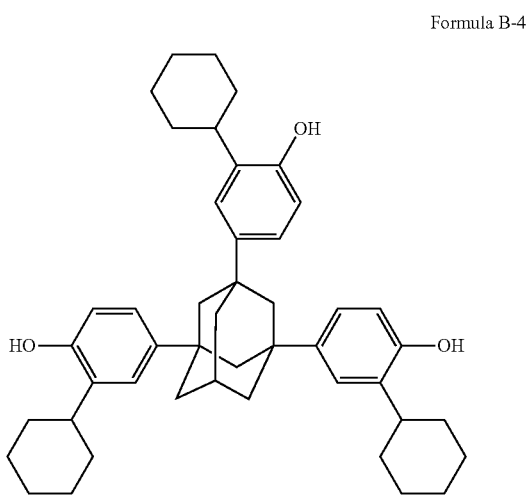

Formula Q-8

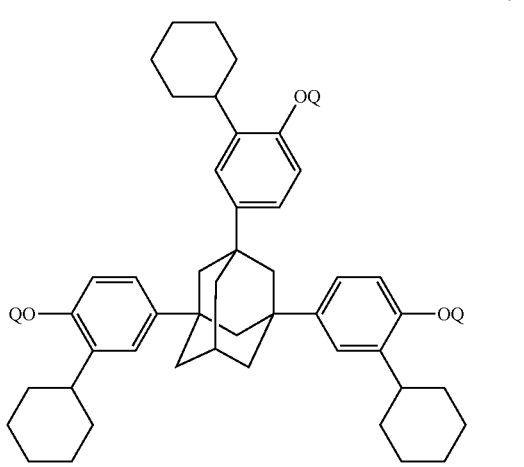

In the formula, Q represents a 1,2-naphthoquinone-2-diazide-4-sulfonic acid group and 100% of the Qs are 1,2-naphthoquinone-2-diazide-4-sulfonic acid groups.

[Production of Positive Photosensitive Resin Composition and Evaluation of Photosensitive Characteristics]

Next, a positive photosensitive resin composition was obtained in the same manner as Example 3 except that the photosensitive diazoquinone compound represented by the formula (Q-4) was changed to one represented by the formula (Q-8). The positive photosensitive resin composition was evaluated in the same manner as Example 3.

As a result, it was found that when the developing time is 38 seconds×twice, the difference between the film thicknesses of an unexposed portion of the coating film after the prebaking and the film thickness of the same after the development is 2 μm; moreover, the sensitivity was 270 mJ/cm². Scum was found around the openings. At this time, the resolution was as low as 25 μm.

TABLE 3

| | Resin (Common) | Photo-sensitive Agent | Sensitivity | Resolution | Scum |
|---|---|---|---|---|---|
| Example 3 | (A-3) | (Q-4) | 200 mJ/cm$^2$ | 3 μm | No |
| Comparative Example 4 | (A-3) | (Q-6) | 240 mJ/cm$^2$ | 20 μm | Yes |
| Comparative Example 5 | (A-3) | (Q-8) | 270 mJ/cm$^2$ | 25 μm | Yes |

Example 4

Synthesis of Polyamide Resin (A-4)

A dicarboxylic acid derivative (active ester) of 371.79 g (0.800 mol), 4,4'-methylenebis(2-amino-3,6-dimethylphenol) of 128.87 g (0.450 mol) and hexafluoro-2,2-bis(3-amino-4-hydroxyphenyl)propane of 201.50 g (0.550 mol) were put in a four-neck separable flask equipped with a thermometer, stirrer, raw material inlet and dry nitrogen gas feed pipe, the derivative being obtained by the reaction of isophthalic acid of 0.240 mol, diphenyl ether-4,4'-dicarboxylic acid of 0.560 mol and 1-hydroxy-1,2,3-benzotriazole of 1.600 mol. N-methyl-2-pyrrolidone of 2,800 g was added to dissolve them. The mixture was reacted at 75° C. for 16 hours with an oil bath.

Next, 82.08 g (0.500 mol) of 5-norbornene-2,3-dicarboxylic anhydride dissolved in 330 g of N-methyl-2-pyrrolidone was added thereto and the mixture was stirred for 3 hours to complete the reaction. After filtering the reaction mixture, the reaction mixture was poured into a mixed solution of water and isopropanol at 3:1 (volume ratio). The resulting precipitate was collected by filtration, washed sufficiently with water, and dried under vacuum to obtain the target polyamide resin (A-4) having a number average molecular weight of 9,000.

[Production of Positive Photosensitive Resin Composition]

The thus-synthesized polyamide resin (A-4) of 100 g, the photosensitive diazoquinone compound having a structure represented by the formula (Q-4) of 19 g, and a silicon compound having a structure represented by the formula (C-1) of 8 g were dissolved in γ-butyrolactone of 200 g. Then, the mixture was filtered with a Teflon (trademark) filter having a pour diameter of 0.2 μm to obtain a positive photosensitive resin composition.

[Evaluation of Photosensitive Characteristics]

The positive photosensitive resin composition was evaluated in the same manner as Example 2 except that the developing time was controlled so that the difference between the film thickness of an unexposed portion of the coating film after the prebaking and the film thickness of the same after the development is 0.5 μm. As a result, it was found that when the developing time is 95 seconds×twice, the difference between the film thicknesses of the unexposed portion of the coating film after the prebaking and the film thickness of the same after the development is 0.5 μm; moreover, the sensitivity was 210 mJ/cm$^2$. No scum was found around the openings. At this time, the resolution was as high as 3 μm.

Comparative Example 6

Production of Positive Photosensitive Resin Composition and Evaluation of Photosensitive Characteristics A positive photosensitive resin composition was obtained in the same manner as Example 4 except that the photosensitive diazoquinone compound represented by the formula (Q-4) was changed to one represented by the formula (Q-6). The positive photosensitive resin composition was evaluated in the same manner as Example 4.

As a result, it was found that when the developing time is 140 seconds×twice, the difference between the film thicknesses of an unexposed portion of the coating film after the prebaking and the film thickness of the same after the development is 0.5 μm; moreover, the sensitivity was 250 mJ/cm$^2$. Scum was found around the openings. At this time, the resolution was as low as 18 μm.

Comparative Example 7

Production of Positive Photosensitive Resin Composition and Evaluation of Photosensitive Characteristics A positive photosensitive resin composition was obtained in the same manner as Example 4 except that the photosensitive diazoquinone compound represented by the formula (Q-4) was changed to one represented by the formula (Q-8). The positive photosensitive resin composition was evaluated in the same manner as Example 4.

As a result, it was found that when the developing time is 148 seconds×twice, the difference between the film thicknesses of an unexposed portion of the coating film after the prebaking and the film thickness of the same after the development is 0.5 μm; moreover, the sensitivity was 270 mJ/cm$^2$. Scum was found around the openings. At this time, the resolution was as low as 15 μm.

TABLE 4

| | Resin (Common) | Photo-sensitive Agent | Sensitivity (mJ/cm$^2$) | Resolution (μm) | Developing time | Film Thickness Difference (μm) | Scum |
|---|---|---|---|---|---|---|---|
| Example 4 | (A-4) | (Q-4) | 210 | 3 | 95 sec. × 2 | 0.5 | No |
| Comparative Example 6 | (A-4) | (Q-6) | 250 | 18 | 140 sec. × 2 | 0.5 | Yes |
| Comparative Example 7 | (A-4) | (Q-8) | 270 | 15 | 148 sec. × 2 | 0.5 | Yes |

Example 5

Synthesis of Polyamide Resin (A-5)

3,3'-diaminodiphenylsulfone of 24.83 g (0.100 mol) and N-methyl-2-pyrrolidone of 2,000 g were put and dissolved in a four-neck separable flask equipped with a thermometer, stirrer, raw material inlet and dry nitrogen gas feed pipe. Then, while water-cooling the flask, 4,4'-oxydiphthalic anhydride of 26.06 g (0.084 mol) was gradually added thereto.

After reacting the mixture at room temperature for two hours, hexafluoro-2,2-bis(3-amino-4-hydroxyphenyl)propane of 219.82 g (0.600 mol), 3,3'-diamino-4,4'-dihydroxydiphenylmethane of 69.08 g (0.300 mol) and N-methyl-2-pyrrolidone of 500 g were added and the mixture was reacted at room temperature for one hour. Then, a dicarboxylic acid derivative (active ester) of 364.53 g (0.756 mol) and N-methyl-2-pyrrolidone of 320 g were added to the mixture, the derivative being obtained by the reaction of isophthalic acid of 0.084 mol, diphenyl ether-4,4'-dicarboxylic acid of 0.672 mol and 1-hydroxy-1,2,3-benzotriazole of 1.512 mol. The mixture was reacted at 60° C. for 14 hours with an oil bath. Next, 68.86 g (0.400 mol) of 4-ethynylphthalic anhydride dissolved in 270 g of N-methyl-2-pyrrolidone was added thereto and the mixture was stirred for 3 hours to complete the reaction. After filtering the reaction mixture, the reaction mixture was poured into a mixed solution of water and isopropanol at 3:1 (volume ratio). The resulting precipitate was collected by filtration, washed sufficiently with water, and dried under vacuum to obtain the target polyamide resin (A-5) having a number average molecular weight of 7,800.

[Production of Positive Photosensitive Resin Composition]

The thus-synthesized polyamide resin (A-5) of 100 g, the photosensitive diazoquinone compound having a structure represented by the formula (Q-3) of 8 g, the photosensitive diazoquinone compound having a structure represented by the formula (Q-4) of 10 g, and a silicon compound having a structure represented by the formula (C-1) of 8 g were dissolved in γ-butyrolactone of 180 g. Then, the mixture was filtered with a Teflon (trademark) filter having a pour diameter of 0.2 μm to obtain a positive photosensitive resin composition.

[Evaluation of Photosensitive Characteristics]

The positive photosensitive resin composition was evaluated in the same manner as Example 2. As a result, it was found that when the developing time is 36 seconds×twice, the difference between the film thicknesses of the unexposed portion of the coating film after the prebaking and the film thickness of the same after the development is 1 μm; moreover, the sensitivity was 330 mJ/cm². No scum was found around the openings. At this time, the resolution was as high as 5 μm.

Comparative Example 8

Production of Positive Photosensitive Resin Composition and Evaluation of Photosensitive Characteristics A positive photosensitive resin composition was obtained in the same manner as Example 5 except that the photosensitive diazoquinone compound represented by the formula (Q-3) was changed to one represented by the formula (Q-5) and the photosensitive diazoquinone compound represented by the formula (Q-4) was changed to one represented by the formula (Q-6). The positive photosensitive resin composition was evaluated in the same manner as Example 2.

As a result, it was found that when the developing time is 48 seconds×twice, the difference between the film thicknesses of an unexposed portion of the coating film after the prebaking and the film thickness of the same after the development is 1 μm; moreover, the sensitivity was 380 mJ/cm². Scum was found around the openings. At this time, the resolution was as low as 30 μm.

Comparative Example 9

Production of Positive Photosensitive Resin Composition and Evaluation of Photosensitive Characteristics A positive photosensitive resin composition was obtained in the same manner as Example 5 except that the photosensitive diazoquinone compound represented by the formula (Q-3) was changed to one represented by the formula (Q-7) and the photosensitive diazoquinone compound represented by the formula (Q-4) was changed to one represented by the formula (Q-8). The positive photosensitive resin composition was evaluated in the same manner as Example 2.

As a result, it was found that when the developing time is 53 seconds×twice, the difference between the film thicknesses of an unexposed portion of the coating film after the prebaking and the film thickness of the same after the development is 1 μm; moreover, the sensitivity was 430 mJ/cm². Scum was found around the openings. At this time, the resolution was as low as 25 μm.

TABLE 5

| | Resin (Common) | Photo-sensitive Agent | Sensitivity (mJ/cm²) | Resolution (μm) | Developing time | Film Thickness Difference (μm) | Scum |
|---|---|---|---|---|---|---|---|
| Example 5 | (A-5) | (Q-3) + (Q-4) | 330 | 5 | 36 sec. × 2 | 1 | No |
| Comparative Example 8 | (A-5) | (Q-5) + (Q-6) | 380 | 30 | 48 sec. × 2 | 1 | Yes |
| Comparative Example 9 | (A-5) | (Q-7) + (Q-8) | 430 | 25 | 53 sec. × 2 | 1 | Yes |

Table 5 shows that the positive photosensitive resin composition comprising the specific photosensitive agent (B) produces no scum, provides high sensitivity and high resolution, and shows high productivity in the production of a relief pattern. Also, it is indicated that when formed into a protecting film and insulating film, the positive photosensitive resin composition produces no scum, provides high sensitivity and high resolution, and shows high productivity in the production of a relief pattern. It is also indicated that a semiconductor device and display device comprising such a cured film also show excellent performances.

The invention claimed is:
1. A positive photosensitive resin composition comprising:
a polyamide resin (A) including a repeating unit represented by the following formula (1), and
a photosensitive agent (B) comprising an ester of at least one kind of phenolic compound selected from the group consisting of the following formulae (b-1) to (b-5) with at least one of 1,2-naphthoquinonediazide-4-sulfonic acid and 1,2-naphthoquinonediazide-5-sulfonic acid:

Formula (1)

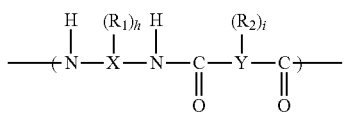

wherein X is at least one kind of organic group selected from the group consisting of the following formulae (6-1) to (6-7) and Y is at least one kind of organic group selected from the group consisting of the following formulae (8-1) to (8-8); $R_1$ is a hydroxyl group, —O—$R_3$, an alkyl group, an acyloxy group or a cycloalkyl group; $R_2$ is a hydroxyl group, a carboxyl group, —O—$R_3$ or —COO—$R_3$; h is an integer from 0 to 8; i is an integer from 0 to 8; $R_3$ is an organic group having 1 to 15 carbon atoms; when there are plurality of $R_1$s, $R_2$s or $R_3$s, they may be the same or different from each other; when there is no hydroxyl group as $R_1$, at least one $R_2$ has to be a carboxyl group; and when there is no carboxyl group as $R_2$, at least one $R_1$ has to be a hydroxyl group, Formula (6)

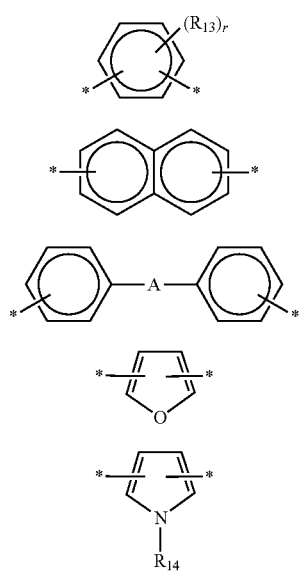

Formula (6-1)

Formula (6-2)

Formula (6-3)

Formula (6-4)

Formula (6-5)

Formula (6-6)

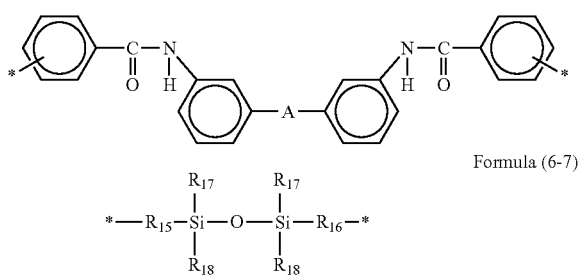

Formula (6-7)

in the formulae, * means being connected to an NH group; A is —$CH_2$—, —$CH(CH_3)$—, —$C(CH_3)_2$—, —O—, —S—, —$SO_2$—, —CO—, —NHCO—, —$C(CF_3)_2$— or a single bond; $R_{13}$ is one selected from an alkyl group, an alkyl ester group and a halogen atom, and $R_{13}$s may be the same or different from each other; $R_{14}$ is an of an alkyl group, an alkoxy group, an acyloxy group and a cycloalkyl group, and $R_{14}$s may be the same or different from each other; r is an integer of 0 to 4; and each of $R_{15}$ to $R_{18}$ is an organic group, Formula (8)

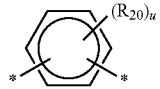

Formula (8-1)

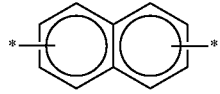

Formula (8-2)

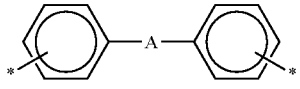

Formula (8-3)

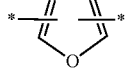

Formula (8-4)

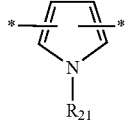

Formula (8-5)

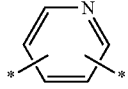

Formula (8-6)

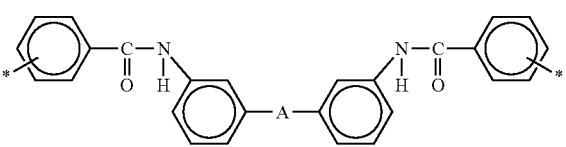

Formula (8-7)

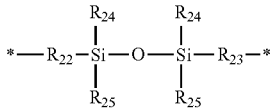

Formula (8-8)

in the formulae, * means being connected to a C=O group; A is —$CH_2$—, —$CH(CH_3)$—, —$C(CH_3)_2$—, —O—, —S—, —$SO_2$—, —CO—, —NHCO—, —$C(CF_3)_2$— or a single bond; $R_{20}$ is one selected from an alkyl group, an alkyl ester group and a halogen atom, and $R_{20}$s may be the same or different from each other; $R_{21}$ is one selected from a hydrogen atom, an alkyl group, an alkyl ester group and a halogen atom; each of $R_{22}$ to $R_{25}$ is an organic group, and u is an integer of 0 to 4; and (b)

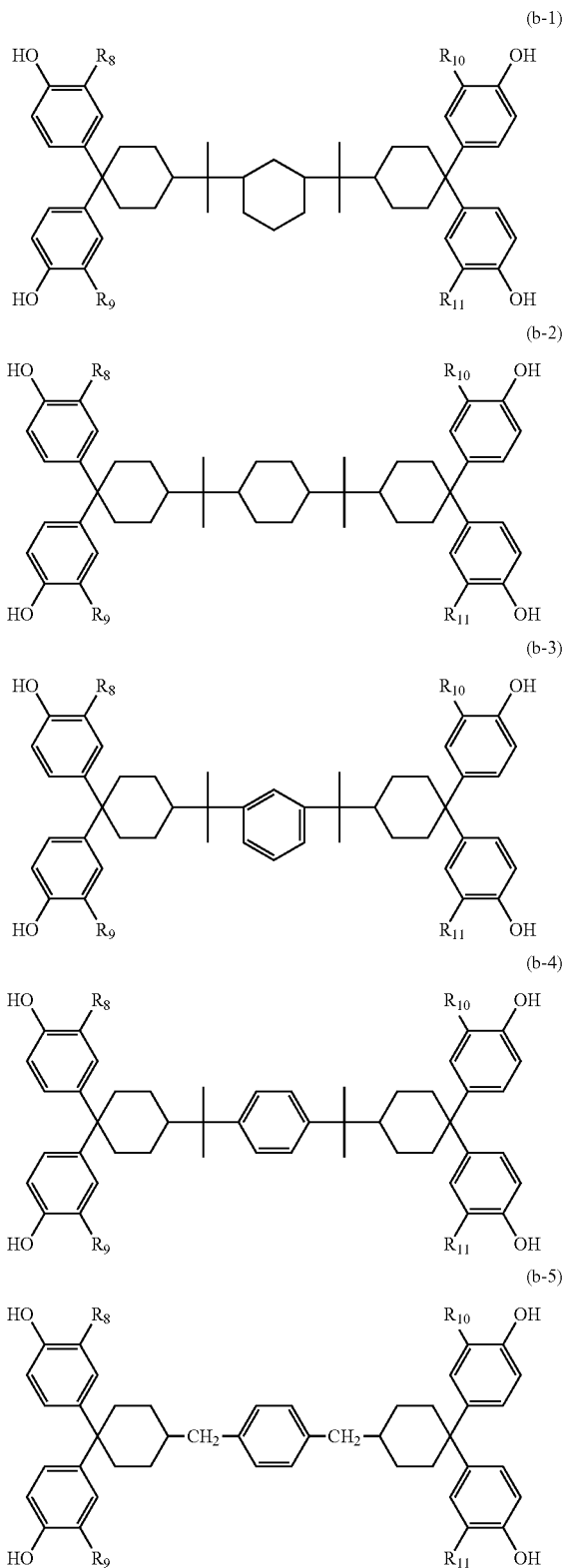

wherein each of $R_8$ to $R_{11}$ is a methyl group or an ethyl group; and the $R_8$s, $R_9$s, $R_{10}$s or $R_{11}$s may be the same or different from each other.

2. The positive photosensitive resin composition according to claim 1, wherein in the polyamide resin (A), X of the formula (1) contains a repeating unit having a structure selected from the group consisting of the following formulae (3-1) to (3-6):

Formula (3)

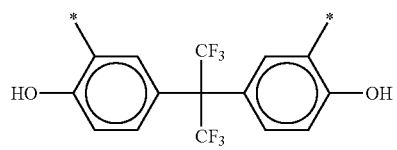

Formula (3-1)

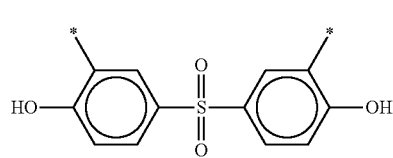

Formula (3-2)

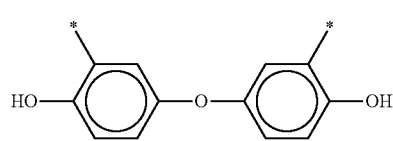

Formula (3-3)

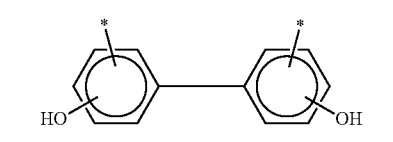

Formula (3-4)

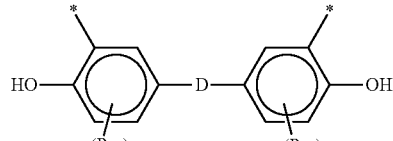

Formula (3-5)

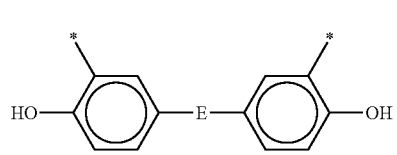

Formula (3-6)

wherein * means being connected to an NH group; D in the formula (3-5) is —CH$_2$—, —CH(CH$_3$)—, —C(CH$_3$)$_2$—, —O—, —S—, —SO$_2$—, —CO—, —NHCO—, —C(CF$_3$)$_2$— or a single bond; E in the formula (3-6) is —CH$_2$—, —CH(CH$_3$)— or —C(CH$_3$)$_2$—; $R_{12}$ is an alkyl group, an alkoxy group, an acyloxy group or a cycloalkyl group; s is an integer from 1 to 3; and when there are plurality of $R_{12}$s, they may be the same or different from each other.

3. The positive photosensitive resin composition according to claim 1, wherein the phenolic compound contains at least one or more kinds selected from the group consisting of the following formulae (5-1) to (5-5):

Formula (5)
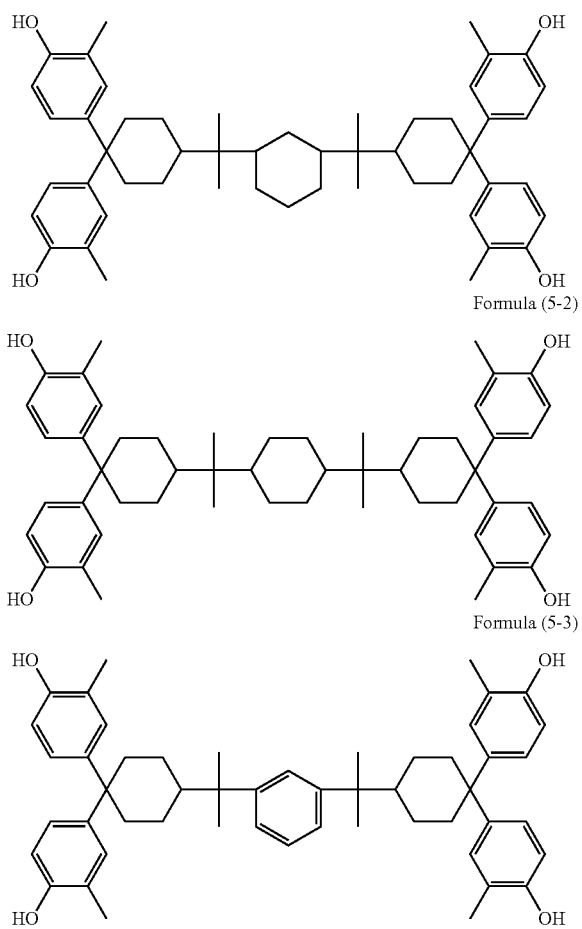
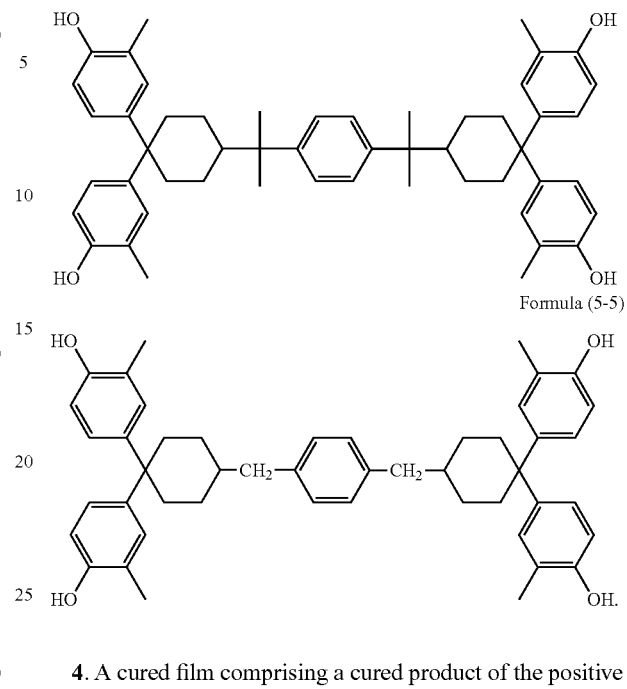
4. A cured film comprising a cured product of the positive photosensitive resin composition defined by claim 1.
5. A protecting film comprising the cured film defined by claim 4.
6. An insulating film comprising the cured film defined by claim 4.
7. A semiconductor device having the cured film defined by claim 4.
8. A display device having the cured film defined by claim 4.
* * * * *